(12) United States Patent  
Wang et al.

(10) Patent No.: US 9,086,227 B2  
(45) Date of Patent: Jul. 21, 2015

(54) METHOD AND SYSTEM FOR LIGHT COLLECTION AND LIGHT ENERGY CONVERTING APPARATUS

(75) Inventors: Liang-De Wang, Tainan (TW); Yuan-Xiang Zou, Tainan (TW); Li-Chi Pan, Hsinchu County (TW); Pin Chang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 1170 days.

(21) Appl. No.: 12/358,228

(22) Filed: Jan. 22, 2009

(65) Prior Publication Data

US 2010/0078062 A1 Apr. 1, 2010

(30) Foreign Application Priority Data

Sep. 26, 2008 (TW) ................................ 97137218 A

(51) Int. Cl.  
H01L 31/054 (2014.01)  
F24J 2/06 (2006.01)  
F24J 2/08 (2006.01)  
(Continued)

(52) U.S. Cl.  
CPC .............. F24J 2/06 (2013.01); H01L 31/0543 (2014.12); H01L 31/0547 (2014.12); *F24J 2/08* (2013.01); *F24J 2/085* (2013.01); *F24J 2/18* (2013.01);  
(Continued)

(58) Field of Classification Search  
CPC ... H01L 31/00; H01L 31/052; H01L 31/0522; H01L 31/0525; H01L 31/0232; H01L 31/02325; H01L 31/0524; H01L 31/0543; H01L 31/0547; F24J 2/00; F24J 2/06; F24J 2/10; F24J 2/1057; F24J 2/12

USPC ................ 136/246, 259; 126/678, 684  
See application file for complete search history.

(56) References Cited

U.S. PATENT DOCUMENTS 4,114,592 A 9/1978 Winston  
4,313,024 A 1/1982 Horne  
(Continued)

FOREIGN PATENT DOCUMENTS

CN 1582378 2/2005  
CN 201215596 4/2009  
(Continued)

OTHER PUBLICATIONS

"1st Office Action of China Counterpart Application", issued on Jan. 31, 2011, p. 1-p. 5.  
(Continued)

*Primary Examiner* — Christina Chern  
(74) *Attorney, Agent, or Firm* — Jianq Chyun IP Office

(57) ABSTRACT

A light collection system including a light concentrating device and a reflective curving-surface device is provided. The light concentrating device receives at least a portion of an incident light and forwardly emits the portion of the incident light after concentrating and passing it through a first focal region, so as to obtain a first-stage output light. The reflective curving-surface device has an entrance aperture for receiving the first-stage output light. The reflective curving-surface device includes a reflective inner curving surface, and at least a portion of the reflective inner curving surface has a second focal region. The first focal region and the second focal region are confocal or approximately confocal within a range. As a result, at least a portion of the first-stage output light is confocally converted into a forwardly emitted second-stage output light.

32 Claims, 28 Drawing Sheets

(51) Int. Cl.
*F24J 2/18* (2006.01)
*F24J 2/10* (2006.01)

(52) U.S. Cl.
CPC .......... *F24J 2002/1014* (2013.01); *Y02E 10/44* (2013.01); *Y02E 10/52* (2013.01)

(56) References Cited

U.S. PATENT DOCUMENTS

| | | |
|---|---|---|
| 5,404,869 A | 4/1995 | Parkyn, Jr. et al. |
| 5,894,195 A | 4/1999 | McDermott |
| 6,097,556 A | 8/2000 | Shatz et al. |
| 6,123,436 A | 9/2000 | Hough et al. |
| 6,331,061 B1 | 12/2001 | Shatz et al. |
| 6,541,694 B2 | 4/2003 | Winston et al. |
| 6,547,423 B2 | 4/2003 | Marshall et al. |
| 6,620,995 B2 | 9/2003 | Vasylyev et al. |
| 6,639,733 B2 | 10/2003 | Minano et al. |
| 6,966,661 B2 | 11/2005 | Read |
| 7,160,522 B2 | 1/2007 | Minano Dominguez et al. |
| 7,270,454 B2 | 9/2007 | Amano |
| 2002/0085393 A1 | 7/2002 | Eisenman et al. |
| 2002/0139414 A1 | 10/2002 | Vasylyev et al. |
| 2005/0057828 A1 | 3/2005 | Read |
| 2006/0239006 A1 | 10/2006 | Chaves et al. |
| 2007/0188876 A1 | 8/2007 | Hines et al. |
| 2007/0256724 A1 | 11/2007 | Fork et al. |

FOREIGN PATENT DOCUMENTS

| | | |
|---|---|---|
| DE | 1472267 | 12/1969 |
| DE | 19630240 | 1/1998 |
| EP | 0144950 | 6/1985 |
| EP | 1852918 | 11/2007 |
| TW | 200412410 | 7/2004 |
| TW | I238235 | 8/2005 |
| TW | M333656 | 6/2008 |
| WO | 2008112180 | 9/2008 |

OTHER PUBLICATIONS

"First Office Action of Australia Counterpart Application", notified on Mar. 8, 2011, p. 1-p. 3.

"First Office Action of German Counterpart Application" with English translation thereof, issued on Jul. 9, 2012, p. 1-p. 13.

"Office Action of Taiwan Counterpart Application", issued on Mar. 18, 2013, p. 1-p. 18.

"Office Action of German Counterpart Application", issued on Jan. 14, 2014, with English translation thereof, p. 1-p. 7.

"Office Action of European Counterpart Application", issued on Jan. 20, 2015, p. 1-p. 8.

METHOD AND SYSTEM FOR LIGHT COLLECTION AND LIGHT ENERGY CONVERTING APPARATUS

CROSS-REFERENCE TO RELATED APPLICATION

This application claims the priority benefit of Taiwan application serial no. 97137218, filed on Sep. 26, 2008. The entirety of the above-mentioned patent application is hereby incorporated by reference herein and made a part of this specification.

BACKGROUND OF THE INVENTION

1. Field of the Invention

The present invention generally relates to a system and a method of light collection, suitable for application to a light energy conversion mechanism in a solar cell module or for converting solar energy.

2. Description of Related Art

A light collection system collects a great number of incident lights and then emits the lights in a denser form through a smaller optical region. A light collection system may be applied to a solar cell and the heat collection of solar energy.

A solar cell needs to absorb an incident light effectively. However, a portion of the incident light is reflected due to the nature physical phenomena. FIG. 1 illustrates optical refraction and reflection. Referring to FIG. 1, a transparent layer 100 having a refractive index n receives an incident light 102a through the air. Based on the optical refraction phenomenon, a refracted light 102b enters the transparent layer 100 and a reflected light 102c is reflected according to the incident angle θ of the incident light 102a. FIG. 2 illustrates the relationship between an incident angle and a reflectivity. Glass and air interface are taken as an example. Referring to FIG. 2, regarding the reflection of a light outside of a medium, when the incident angle θ is greater than a specific angle (for example, greater than 60°, the reflection is considerably increased, and accordingly the reflected light 102c gets more and more intense. In other words, the less refracted light 102b enters the transparent layer 100, the lower the optical efficiency is.

FIG. 3 illustrates the relationship between an incident angle of a light and the absorption response of a solar cell. Referring to FIG. 3, the absorption corresponding to an incident angle of 0° will be described as an example. When the incident angle is greater than 50°, the absorption of the solar cell starts to decrease drastically. Accordingly, in an unsatisfactory light collection design, if there are too many lights entering a solar cell at greater angles, the photovoltaic conversion efficiency of the solar cell will be reduced due to the unsatisfactory absorption efficiency thereof. In other words, the optical design of a highly-efficient light collection system in a solar cell has to allow most incident lights to enter the solar cell at angles smaller than 50°. However, the disadvantage of such a design falls on the some kinds of low-f-number solar cell light collectors.

Various designs of low-f-number solar concentrator have been provided. FIG. 4 illustrates the structure of a low-f-number solar cell light collector. Referring to FIG. 4, the light collector 400 of a solar cell receives an incident light 401. After the incident light 401 enters a first light collector 402, the low-f-number light collector 400 reflects the incident light 401 based on a total internal reflection (TIR) sawtooth structure 403, and the output light 404 is refracted at a central secondary optical element 405 and is uniformly distributed on the solar cell 406. As a result, a compact design and a high light concentration ratio are both achieved.

However, in foregoing low-f-number light collector 400, most lights enter the solar cell 406 at large angles, and these lights are mostly entered in a large optical entrance area, for example, the outer tooth structure of TIR optics. Besides, sharp teeth 407 have to be designed in the TIR sawtooth structure 403 of the light collector 400 in order to achieve a high optical efficiency. However, in an actual injection molding process, these saw teeth may produce round corner. Accordingly, the optical efficiency of the light collector 400 may be reduced.

FIG. 5 illustrates another refraction-reflection-TIR (RXI) short-focal-length solar light collector. After an incident light 501 enters the solid light collector 500, it is first reflected by a bottom mirror 502, then internal totally reflected by the surface 505 of the light collector 500, and eventually irradiated onto the solar cell 504. An incident light closer to the center is first reflected by the bottom mirror 502 and then reflected by a top mirror 503 before it enters the solar cell 504.

Foregoing RXI compact solar light collector 500 offers both high light collection ratio and very short focal length. However, in this design, the incident light mostly enters the solar cell at a very large angle after it is totally reflected, and accordingly the photovoltaic conversion efficiency of the solar cell is reduced.

FIG. 6 illustrates a conventional Cassegrain reflective solar optical focusing device. In a light collection system 600, after an incident light 601 enters a first reflection surface 602, it is reflected to a second reflection surface 603, then focused on a CPC color mixing element 604, and eventually refracted to a solar cell 605.

Foregoing Cassegrain light collection system 600 offers both a compact design and a high light concentration ratio. In addition, a smaller incident angle and a more uniform irradiance can be obtained through the secondary refractive element 604. However, the assembly tolerance between the primary element 602 and a secondary element 603 in such a light concentrating device is extremely low. Namely, the irradiance of the solar cell required needs very high assembly precision between mirrors and to the color mixing element.

FIG. 7 illustrates another conventional Fresnel light collection system. A most commonly used refractive light collection system 700 has a primary light collection system, wherein the primary light collection system may be a Fresnel lens 701 and which concentrates an incident light at a focus 702 and then collects the light onto a solar cell 704 through direct irradiation or reflection of a secondary optical element 703.

FIG. 8 illustrates the distribution of irradiance on a cross section of a solar cell. As shown in FIG. 8, the received light irradiance is very uneven, and there is a strong light concentration effect in the center area. Such an uneven distribution may cause uneven temperature and irradiance on the solar cell, and accordingly the heat dissipation and the photovoltaic conversion efficiency of the solar cell may be reduced.

There are still many different designs provided regarding different problems in conventional light collection systems. However, the conventional light collection systems have their disadvantages. For example, the low photovoltaic conversion efficiency of a solar cell caused by uneven irradiance, the low absorption and photovoltaic conversion efficiency of a solar cell caused by large incident light angles, the affection of process precision and assembly tolerance to irradiance, and the acceptance angles of the optics are all problems to be resolved in the conventional technique. Accordingly, a better design of light collection system is still to be provided.

SUMMARY OF THE INVENTION

Accordingly, the present invention is directed to a method and an apparatus for light collection, wherein the light collection apparatus comprises a light concentrating device and a reflective curving-surface device. The reflective curving-surface device acts as a light-mapping device, instead of a color mixing element, such that an incident light can enter an absorber at a smaller incident angle with a more suitable irradiance, so as to achieve a higher optical efficiency and to improve the performance of the absorber either in light or thermal energy absorption. The method and apparatus for light collection provided by the present invention may be applied to light uniformization and heat collection of solar photovoltaic and solar thermal light collection lenses to improve the optical efficiency of a solar optical system.

The present invention provides a light collection system comprising a light concentrating device and a reflective curving-surface device. The light concentrating device receives at least a portion of an incident light and forwardly emits the portion of the incident light after concentrating and passing it through a first focal region, so as to obtain a first-stage output light. The reflective curving-surface device has an entrance aperture for receiving the first-stage output light. The reflective curving-surface device includes a reflective inner curving surface, and at least a portion of the reflective inner curving surface has a second focal region. The first focal region and the second focal region are confocal or approximately confocal within a range so that at least a portion of the first-stage output light can be confocally converted into a forwardly emitted second-stage output light.

The present invention also provides a light energy conversion apparatus comprising a light concentrating device, a reflective curving-surface device, and a light energy conversion device. The light concentrating device receives at least a portion of an incident light and forwardly emits the portion of the incident light after concentrating and passing it through a first focal region, so as to obtain a first-stage output light. The reflective curving-surface device has an entrance aperture for receiving the first-stage output light. The reflective curving-surface device includes a reflective inner curving surface, and at least a portion of the reflective inner curving surface has a second focal region. The first focal region and the second focal region are set to be confocal or approximately confocal within a range so that at least a portion of the first-stage output light is confocally converted into a forwardly emitted second-stage output light. The light energy conversion device receives at least a portion of the second-stage output light and converts the optical energy of the second-stage output light into a non-optical energy.

The present invention provides a light collection method. At least a portion of an incident light is received, and the portion of the incident light is forwardly emitted after it is concentrated and passed through a first focal region, so as to obtain a first-stage output light. A reflective curving-surface device is provided, and the reflective curving-surface device has an entrance aperture and a reflective inner curving surface, and at least a portion of the reflective inner curving surface has a second focal region. The second focal region and the first focal region are set to be confocal or approximately confocal within a range for receiving the first-stage output light and for confocally converting at least a portion of the first-stage output light into a forwardly emitted second-stage output light.

The present invention further provides a light collection system comprising a light concentrating device and a reflective surface device. The light concentrating device includes a first reflective inner curving surface, and the light concentrating device receives at least a portion of an incident light and forwardly emits the portion of the incident light after concentrating it through the first reflective curving surface and passing it through a first focal region, so as to obtain a first-stage output light. The reflective surface device includes an entrance aperture, a second reflective inner surface, and an exit aperture. The entrance aperture receives at least the first-stage output light and allows at least a portion of the first-stage output light to be reflected by the second reflective inner surface so as to obtain a forwardly emitted second-stage output light, and forwardly emits the second-stage output light through the exit aperture.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
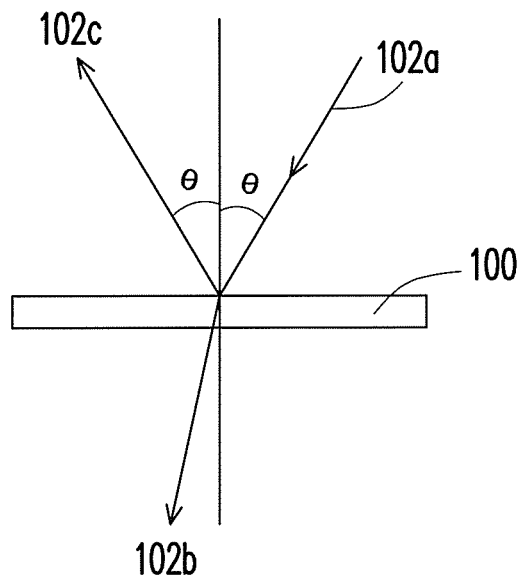
FIG. 1 is a drawing illustrating optical refraction and reflection phenomena.
Figure 2:
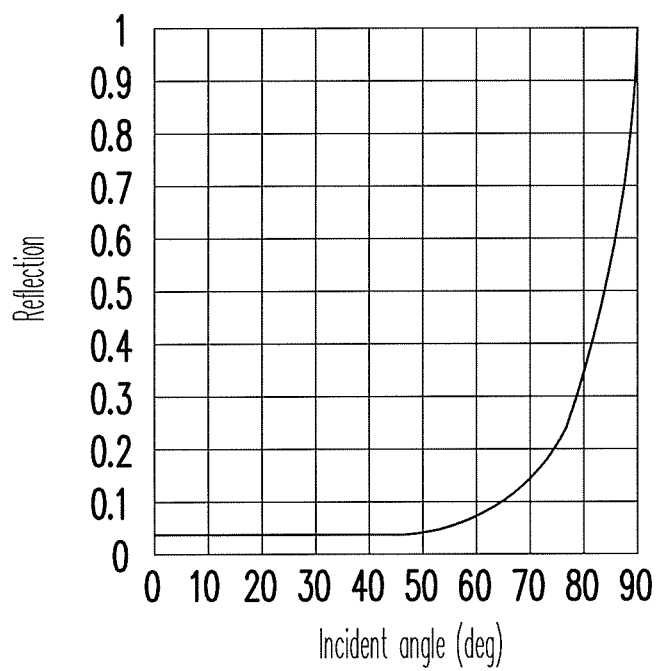
FIG. 2 is a drawing illustrating the relationship between an incident angle and the reflectivity.
Figure 3:
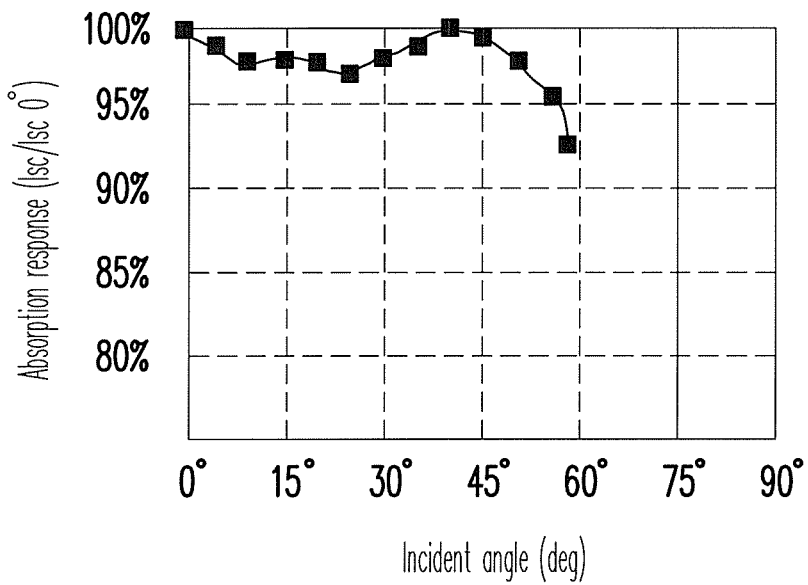
FIG. 3 is a drawing illustrating the relationship between an incident angle of a light and the absorption of a solar cell.
Figure 4:
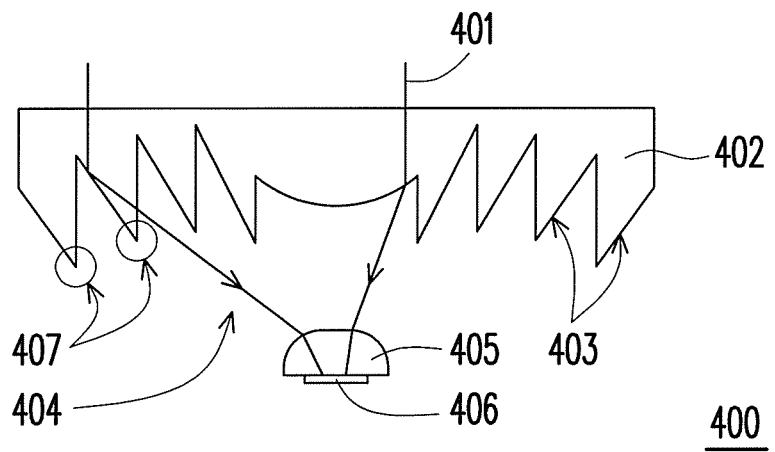
FIG. 4 is a drawing illustrating the structure of a short-focal-length solar cell light collector.

Reference will now be made in detail to the present preferred embodiments of the invention, examples of which are illustrated in the accompanying drawings. Wherever possible, the same reference numbers are used in the drawings and the description to refer to the same or like parts.

The present invention provides a light collection system comprising a light concentrating device and a reflective curving-surface device. The reflective curving-surface device acts as a light-mapping device instead of a color mixing device such that an incident light can then enter an absorber at a smaller incident angle with a more suitable irradiance but not mixing light, so as to achieve a higher optical efficiency and to improve the performance of the absorber in light and thermal energy absorption. If applied to a solar photovoltaic light collector, the uniform distribution of irradiance and the small incident angle of the incident light not only increase the light collection efficiency and reduce the thermal stress, but also increase the absorption of the solar cell and conversion efficiency of the light collector. If applied to a solar thermal light collector, the smaller incident angle and concentrated irradiance also increase the light collection efficiency of the absorber, and besides, in a design that the absorber is disposed at a lower position, a more efficient maintenance structure is provided for maintaining and cleaning the optical system and absorber which are exposed in the changing weather for long time.

In another aspect, a light collection mechanism may comprise a primary light concentrating device, wherein the primary light concentrating device has at least one first focus (focal region). A reflective curving-surface device is disposed below the first focus (focal region), wherein the reflective curving-surface device has an entrance aperture, an reflective inner curving surface, and an exit aperture, and at least a portion of the reflective inner curving surface of the reflective curving-surface device has a second focus (focal region). The first focal region and the second focal region are confocal or approximately confocal within a range. The primary light concentrating device collects an incident light to the confocal region where the first focal region and the second focal region are located and emits the light as a first-stage output light. After the first-stage output light passes through the entrance aperture, at least a portion of the first-stage output light is reflected by the reflective inner curving surface and emitted as a second-stage output light (i.e., a mapping output light) through the exit aperture. Embodiments of the present invention will be described below with reference to accompanying drawings. However, the present invention is not limited to these embodiments. In other words, the contents of these embodiments can be integrated without departing the scope of the present invention.

Figure 9:
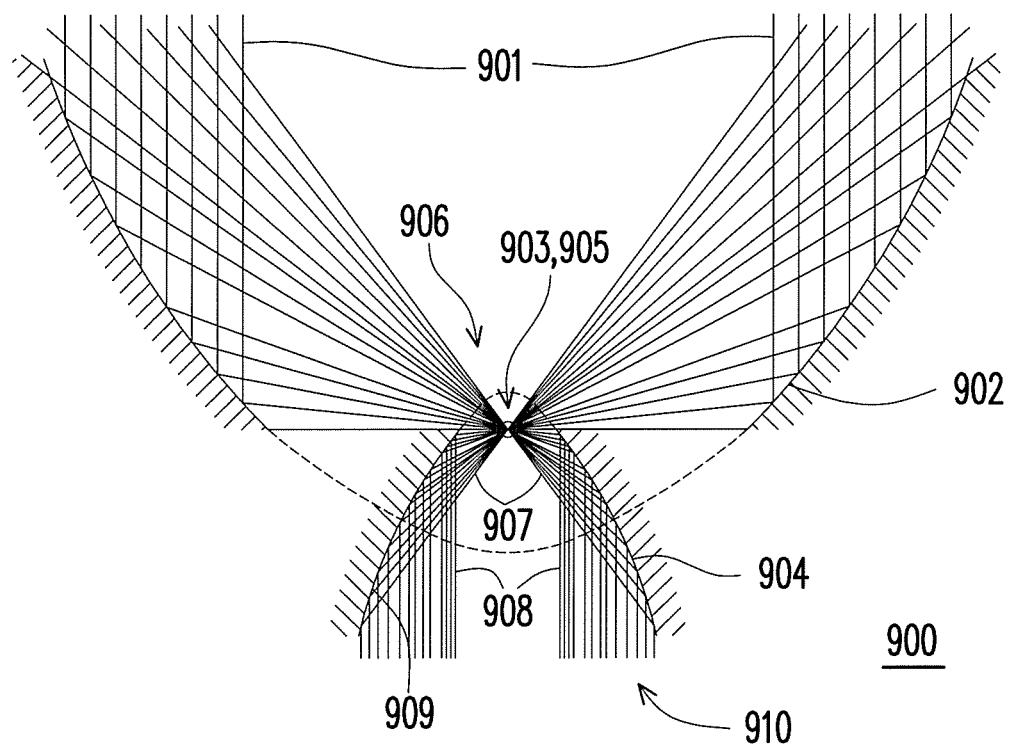
FIG. 9 is a cross-sectional drawing of a light collection system according to an embodiment of the present invention.

FIG. 9 is a cross-sectional drawing of a light collection system according to an embodiment of the present invention. Referring to FIG. 9, the light collection system 900 comprises a light concentrating device 902 and a reflective curving-surface device 904 which are confocal or approximately confocal to each other within a range. The light concentrating device 902 includes a reflective curving surface having a first focus 903, wherein the first focus 903 also represents a focal region, and the size of the focal region is determined by the process precision of the reflective curving surface, or by the design demand. Besides, the reflective curving surface may be a metal-surface reflective layer or a reflective structure made of other materials. The curving surface of the light concentrating device 902 (for example, a paraboloid) has the first focus 903 as its geometrical focus. However, the curving surface of the light concentrating device 902 is not limited to paraboloid, and any other surface structure which can focus can be applied in the present invention, wherein the paraboloid is only a preferred option. The light concentrating device 902 receives and concentrates a portion of an incident light 901. After passing the portion of the incident light 901 through the first focus 903, the light concentrating device 902 emits the light through an exit aperture 906 of the light concentrating device 902 thereof (for example, an aperture 906) as a first-stage output light 907.

The reflective curving-surface device 904 (i.e., an optical reflective mapping device 904) includes a reflective inner curving surface 909, and at least a portion of the reflective inner curving surface has a second focus 905. The reflective curving-surface device 904 has an entrance aperture (i.e., the aperture 906) for receiving the first-stage output light 907. However, in the present invention, the first focus 903 and the second focus 905 are set to be confocal or approximately confocal within a range. The first focus 903 and the second focus 905 do not have to be confocal absolutely; instead they can be set to be approximately confocal according to the process precision or the requirement of design, for example, the uniform spatial distribution or the small angular distribution design required. Because of the confocal setting of the first focus 903 and the second focus 905, the first-stage output light 907 which passes through the first focus 903 also passes through the second focus 905 at the same time. The reflective curving-surface device 904 has a similar structure as the light concentrating device 902 but is disposed opposite thereto, and the structure of the curving surface of the curving-surface reflection device 904 is also preferred to be a paraboloid. Because of the confocal setting of the first focus 903 and the second focus 905, the first-stage output light 907 also passes through the second focus 905 of the reflective curving-surface device 904, then is reflected by the reflective inner curving surface 909, and is eventually emitted through the exit aperture 910. Since the reflective inner curving surface is a paraboloid, the second-stage output light 908 remains its original incident direction and which helps to control the incident angle of the incident light when subsequently the light collection system 900 is applied to a solar cell. The second-stage output light 908 is a mapping output light 908 but not a mixed-light manner. Moreover, the light concentrating device 902 and the reflective curving-surface device 904 could be structurally integrated into an entity or manufactured as a unity, such as plastic injection molding process, so no further alignment device is required.

In addition, if the reflective curving-surface device 904 has a small depth in the direction of the optical axis, the outer portion of the first-stage output light 907 is not received and reflected by the reflective curving-surface device 904 to its original incident direction but is emitted from side places after the incident light is reflected and passed through the second focus 905. However, only a small portion of the incident light is not mapped, and this no-mapped light can be resolved by adjusting the depth of the reflective curving-surface device 904. This present invention can be used on both imaging optics and non-imaging optics.

Figure 10:
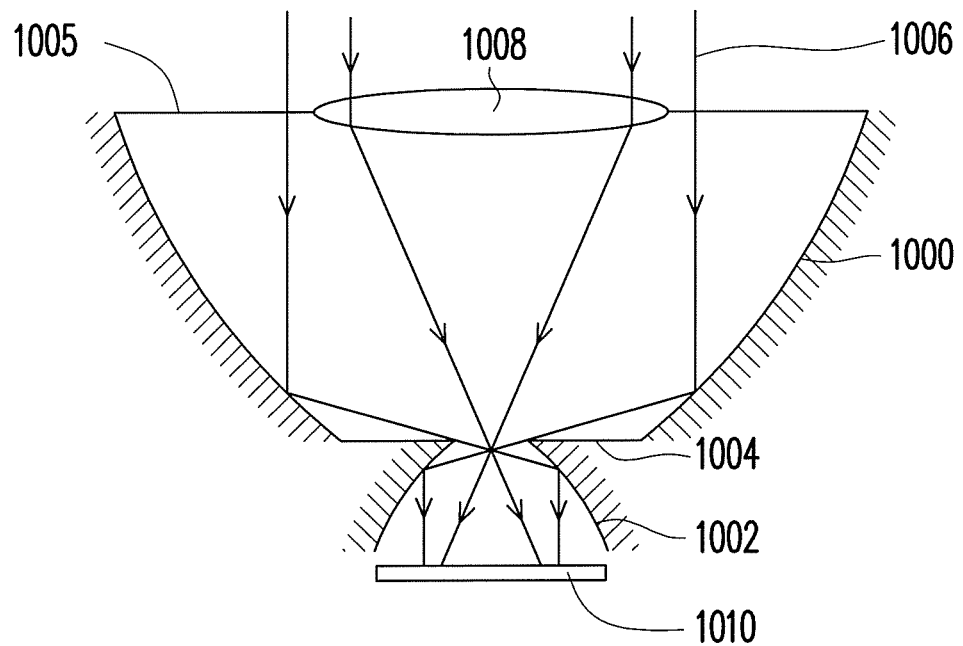
FIGS. 10-15 are cross-sectional drawings of a light collection system according to embodiments of the present invention.

FIGS. 10-15 are cross-sectional drawings of a light collection system according to embodiments of the present invention. Referring to FIG. 10, the two curving surfaces in the present embodiment have the same structures as in FIG. 9, and the light concentrating device 1000 and the reflective curving-surface device 1002 may be bonded together through a bonding structure 1004, or they could be manufactured as a unity. A portion of an incident light 1006 is irradiated on a receiving element 1010 (for example, a solar cell) at a small incident angle (as shown in FIG. 9). The other portion of the incident light 1006 is received by a sub light concentrating device 1008. The sub light concentrating device 1008 may be a convex lens which also has a focus for focusing a portion of the incident light 1006 (i.e the central part of the incident light). However, the focus is usually disposed above the receiving element 1010 to allow the light received by the sub light concentrating device 1008 to pass through the aperture and reach the receiving element 1010. Since the focus of the sub light concentrating device 1008 is not on the receiving element 1010, hot spot on the receiving element 1010 caused by uneven irradiance can be avoided. In the present embodiment, the sub light concentrating device 1008 is a convex lens, and the focus of the convex lens approximately overlaps other focuses. The focus position of the lens can be adjusted according to the actual requirement.

The sub light concentrating device 1008 may be supported differently. For example, the sub light concentrating device 1008 may be supported by a rack. Or, the sub light concentrating device 1008 may be directly fabricated or glued on a transparent plate 1005 or a rack, and the transparent plate 1005 is then laid over or covered on a receiving surface of the light concentrating device 1000.

Figure 11A:
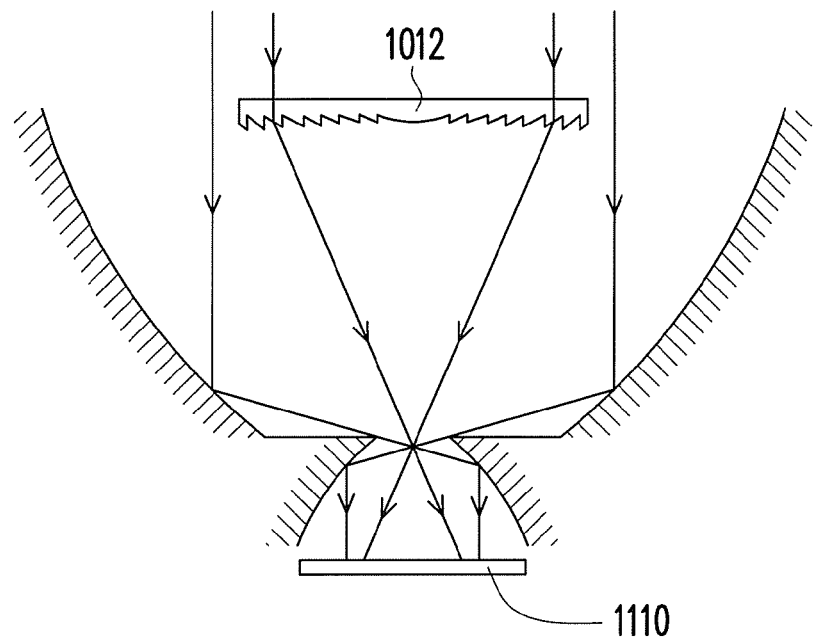
Figure 11B:
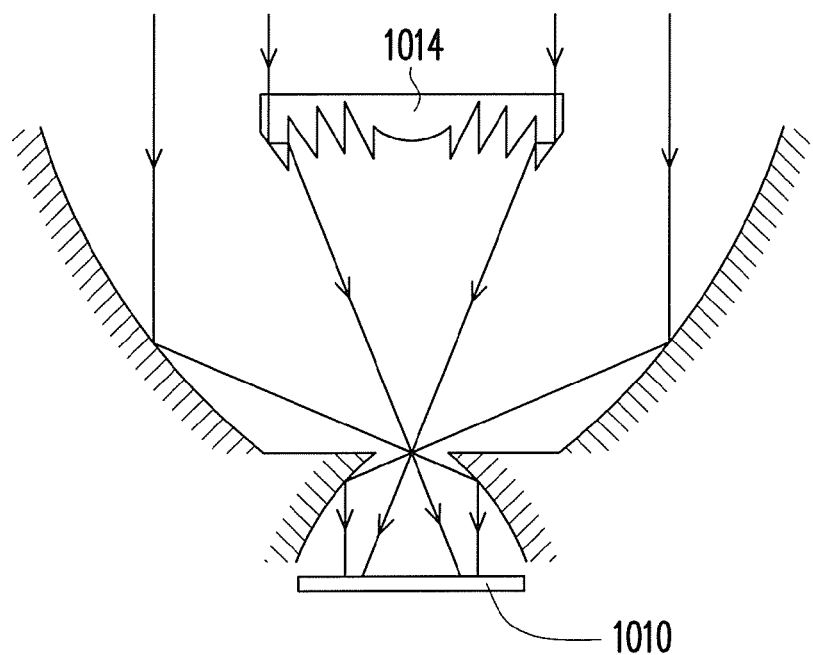

Referring to FIG. 11A, in the present embodiment, the lens structure in the sub light concentrating device 1008 illustrated in FIG. 10 can be replaced by a Fresnel lens 1012, wherein the Fresnel lens 1012 can also achieve a focusing effect. Referring to FIG. 11B, similarly, the sub light concentrating device 1008 may also adopt a sawtooth sharp total internal reflection (TIR) lens 1014 to obtain a high compact design optics.

Some embodiments described above are variations of the mechanism illustrated in FIG. 9, wherein the light concentrating device 902 is implemented as a reflective device. In a common reflective light collection device (for example, a RXI light collection device or a Cassegrain light collection device), a reversely confocal reflective curving-surface device may be disposed under the first focal region of the light collection device (as shown in FIG. 12A and FIG. 12B) to achieve uniform irradiance.

Figure 5:
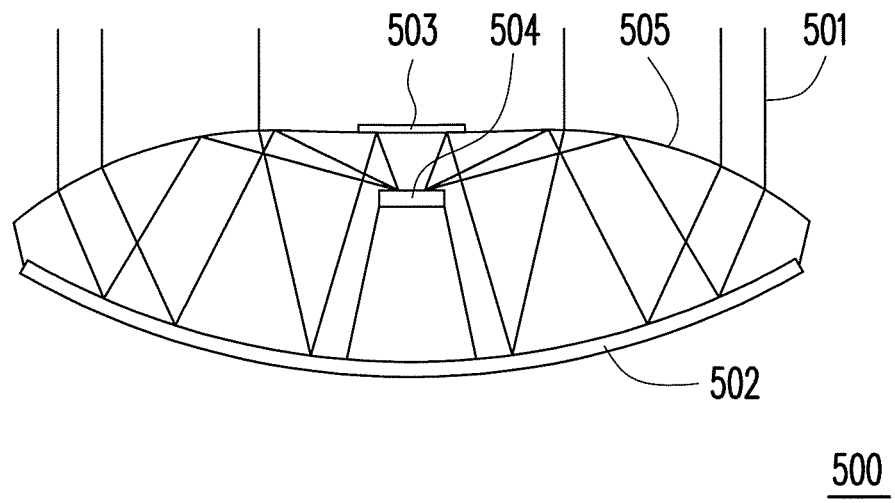
FIG. 5 is a drawing of a refraction-reflection-TIR (RXI) short-focal-length solar light collector.
Figure 12A:
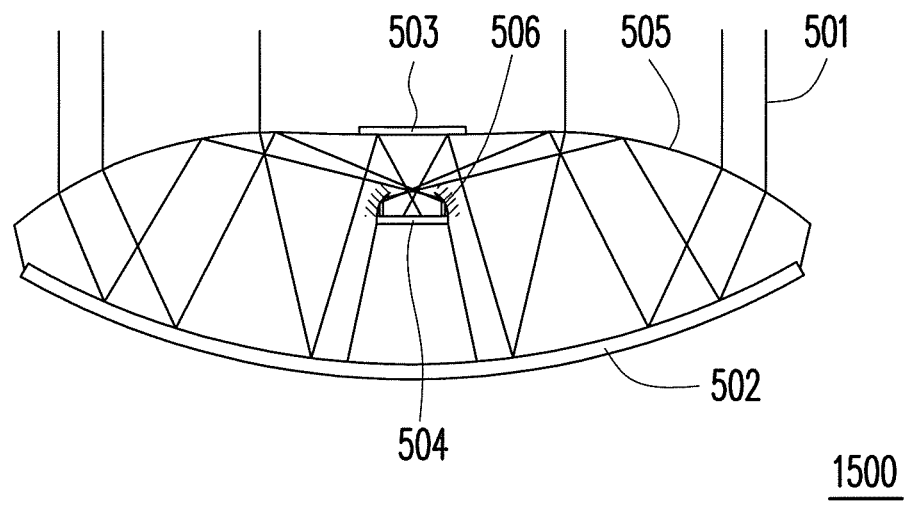

FIG. 12A is a cross-sectional drawing illustrating a RXI light collection device and a reflective curving-surface device which are confocal to each other according to an embodiment of the present invention. FIG. 12B is a cross-sectional drawing of a Cassegrain light concentrating device and a curving-surface reflection device which are confocal to each other according to an embodiment of the present invention. Referring to FIG. 12A, the light concentrating device of the light collection system 1500 in the present embodiment has a similar light concentrating mechanism as that illustrated in FIG. 5, and an incident light is concentrated by a solid light collector and then forwardly enters a secondary optical element 506. The secondary optical element 506 achieves its light reflection and concentration effect by hollowing the solid light collector and adjusting the curving surface. Referring to FIG. 12A, a reflective layer is coated to achieve a light concentrating reflection curving surface.

Figure 6:
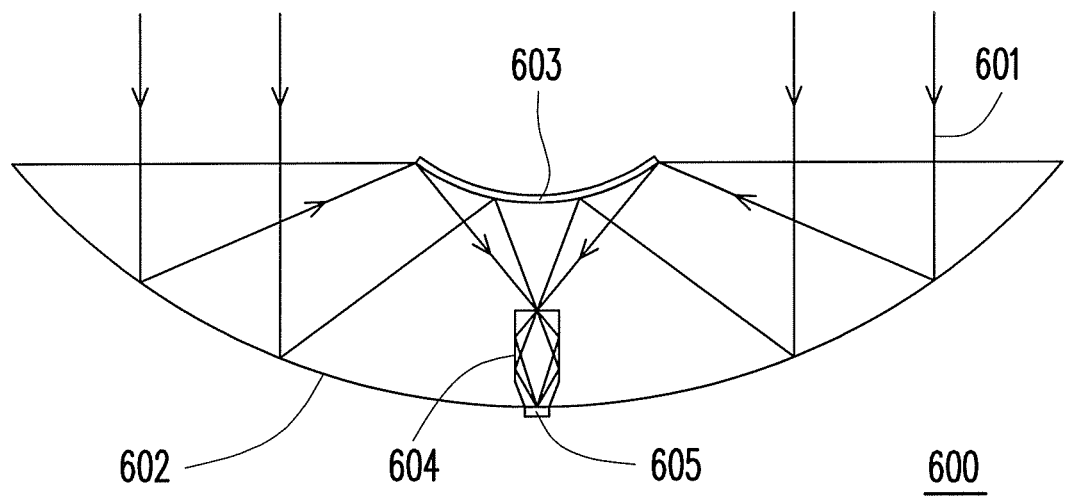
FIG. 6 is a drawing of a conventional Cassegrain reflective solar optical focusing device.
Figure 7:
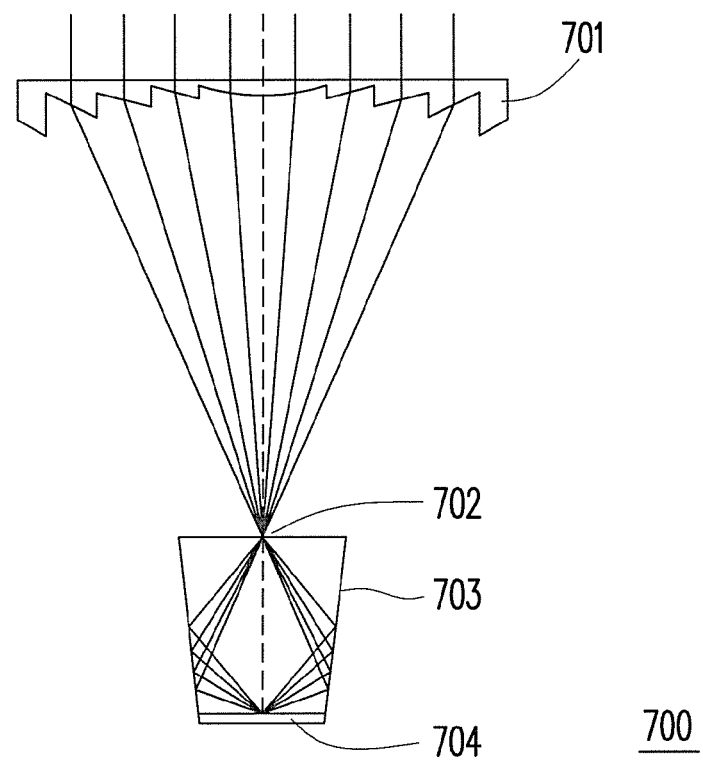
FIG. 7 is a drawing of another conventional Fresnel light collection system.
Figure 8:
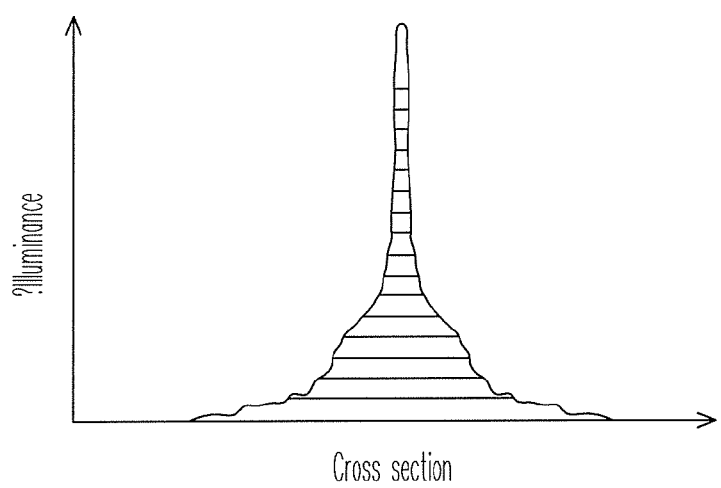
FIG. 8 is a drawing illustrating the distribution of irradiance on a cross section of a solar cell.
Figure 12B:
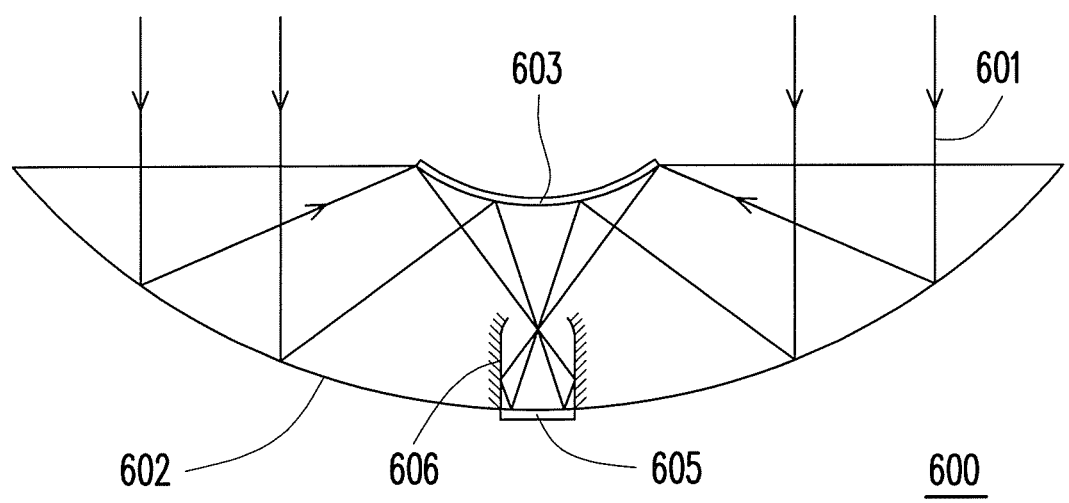

Referring to FIG. 12B, the light concentrating device has a similar light collection mechanism as that shown in FIG. 6. However, the secondary optical element 606 achieves a light reflection and concentration effect by hollowing a solid device and adjusting the curving surface thereof. Referring to FIG. 12B, a reflective layer is coated to achieve a light concentrating reflection curving surface. In other words, according to the present invention, a secondary optical element is implemented as a reflective curving surface such that a uniform incident light can enter a solar cell at a smaller incident angle.

Figure 13:
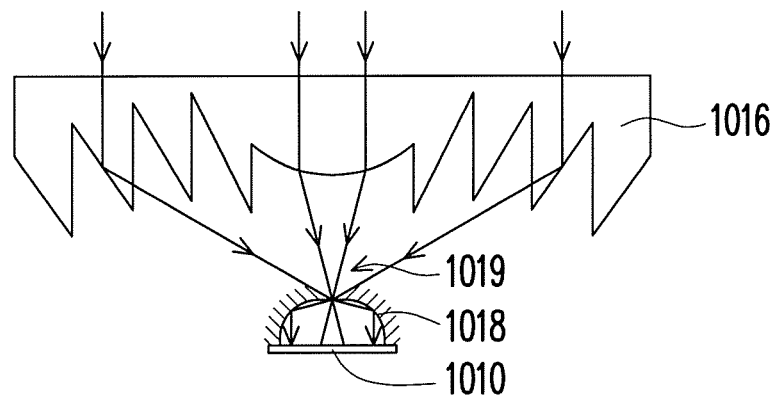

However, the light concentrating device 902 may also be implemented in refractive ones. Referring to FIG. 13, the light concentrating device 902 is replaced by a refractive focusing device 1016, wherein the refractive focusing device 1016 may be a single TIR lens and which receives an incident light at a large area. The refractive focusing device 1016 is set to be confocal with the reflective curving-surface device 1018 so that after the incident light passes through the aperture 1019, it is concentrated and converted to the reflective curving-surface device 1018 and then emitted to the receiving element 1010.

In the embodiments described above, the light concentrating device and the reflective curving-surface device may have a hollow structure which achieves the light collection function through a concave reflection curving surface. However, the reflection curving surface may also be achieved differently. According to the desired optical characteristics, the entire light collection system may also be implemented with a solid high-transmissive material, such as glass or PMMA. Total internal reflection is accomplished through the difference of refractive index between the transmissive material and the air, and the reflective curving surface is then produced along with the curvature of the curving surface.

Figure 14:
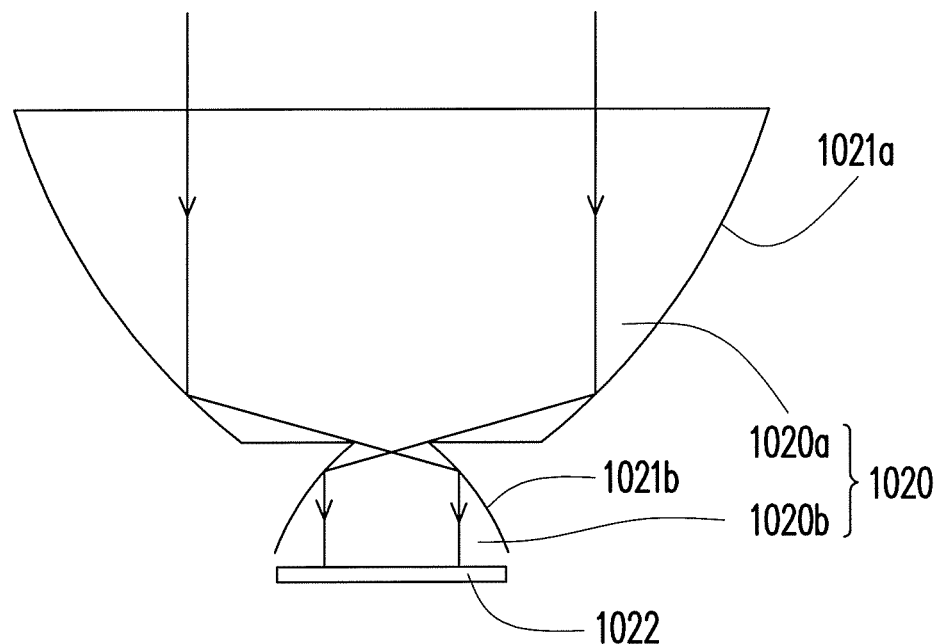

Referring to FIG. 14, the light collection device 1020 may be made of a solid transmissive material and includes an upper light concentrating device 1020a and a lower reflective curving-surface device 1020b. The interface between the light concentrating device 1020a and the air and the refractive indexes thereof produce a TIR curving surface 1021a. The interface between the reflective curving-surface device 1020b and the air and the refractive indexes thereof produce another TIR curving surface 1021b. A portion of an incident light which is reflected and passes through a focal region is reflected by the TIR curving surface 1021b again and then enters the receiving element 1022 at a small incident angle.

Figure 15:
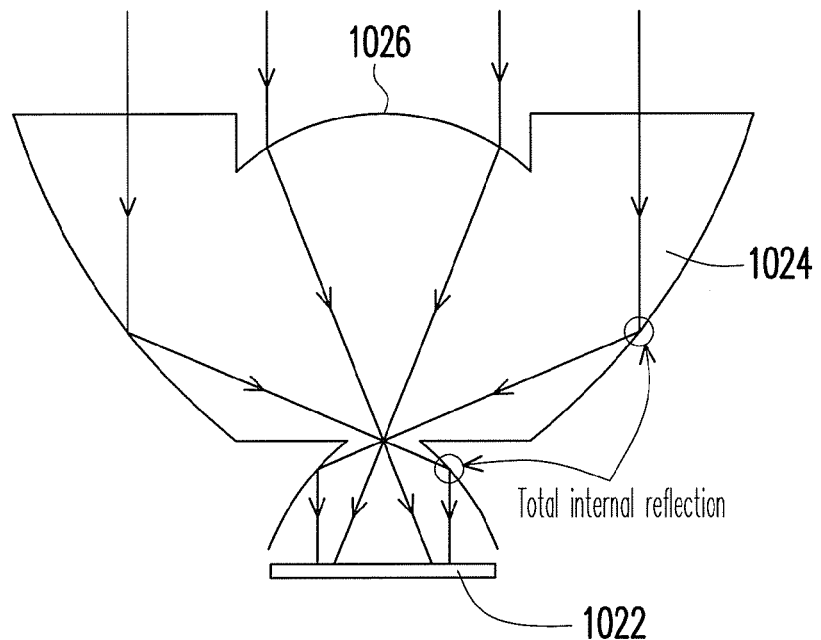

Referring to FIG. 15, a sub light concentrating device 1026 is designed on incident surface by taking the solid structure and the incident light in the central area into consideration. The sub light concentrating device 1026 may be a light concentrating device with convex lens effect. The other elements of the light collection device 1024 have the same structures as those shown in FIG. 14, wherein the effect of a reflective curving surface is achieved through TIR. Besides, the sub light concentrating device 1026 is not limited to the convex lens structure; instead it may also be implemented with a groove-out sawtooth structure or a Fresnel lens structure.

Figure 16:
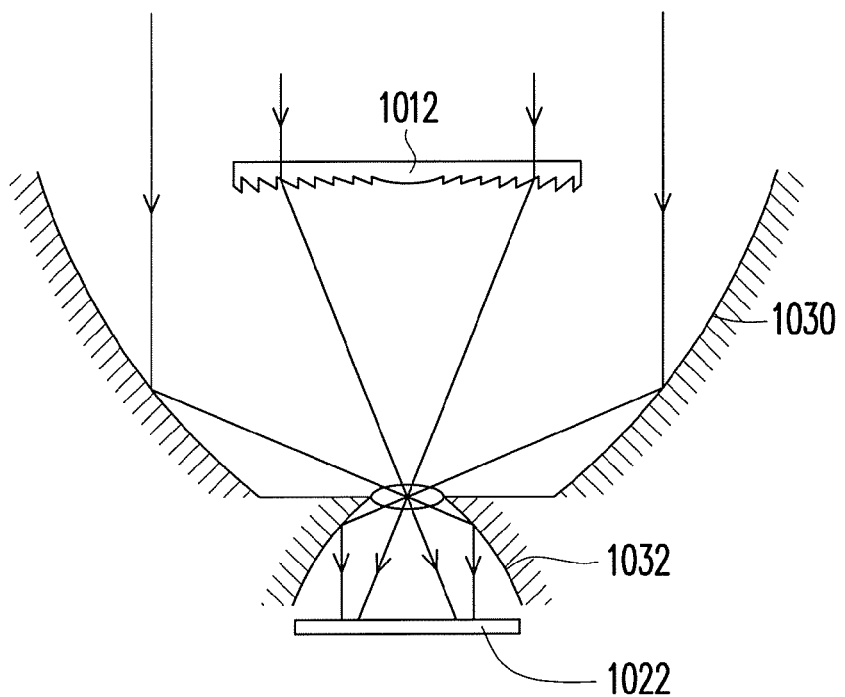
FIG. 16 is a cross-sectional drawing of a light collection system according to an embodiment of the present invention.

FIG. 16 is a cross-sectional drawing of a light collection system according to an embodiment of the present invention. Referring to FIG. 16, in the present embodiment, a sub light concentrating device 1012 (for example, a Fresnel lens) is further disposed in the center of the light collection device composed of a light concentrating device 1030 and a reflective curving-surface device 1032 of a hollow design. The light concentrating device 1030 and the reflective curving-surface device 1032 have a common aperture such that an incident light can reach a receiving element 1022 through the aperture. The light output by the sub light concentrating device 1012 is not reflected by the reflective curving-surface device 1032; instead, it directly enters the receiving element 1022, but the incident angle thereof remains small.

The difference of radiant intensity (W/sr) and irradiance (W/m$^2$) before and after the incident light passes through a secondary optical element (i.e the reflective curving-surface device) will be analyzed herein by taking the structure illustrated in FIG. 16 as an example. The anglular distribution of the incident light can be obtained based on the radiant intensity analysis; and the spatial distribution on the receiver can be obtained based on the irradiance analysis. For example, the light concentration ratio is set to 800, the solar irradiance is set to be 1,000 W/m$^2$, and the perfect absorber for simulation is disposed above the reflective curving-surface device for the case of the analysis at the entrance of the reflective curving surface device.

Figure 17:
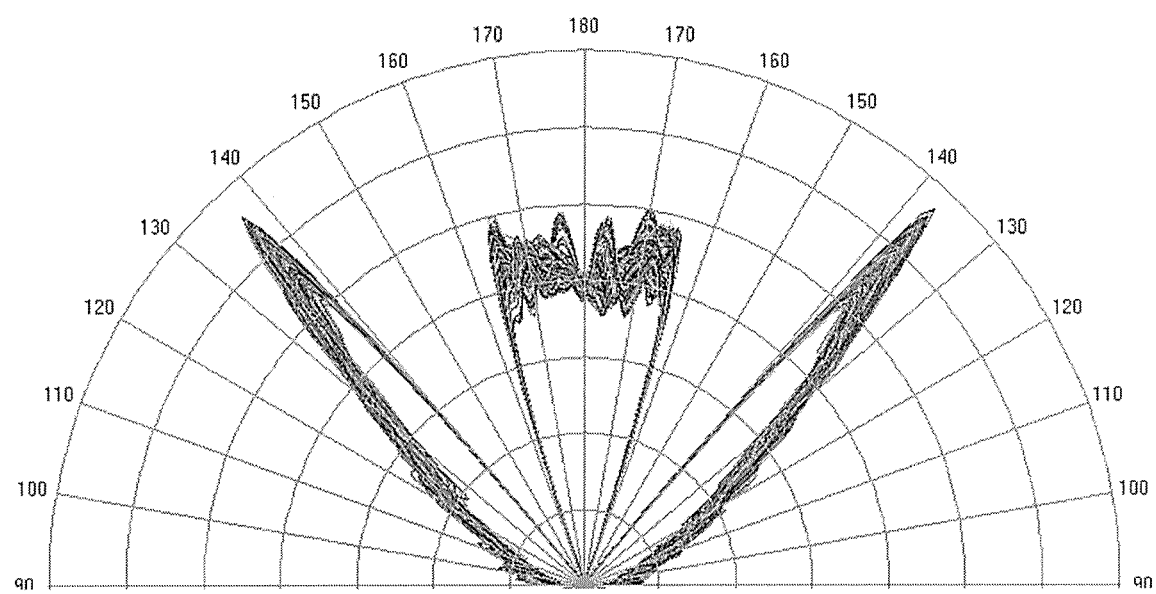
FIG. 17 illustrates the intensity at the entrance of a curving-surface reflection device in FIG. 16.

FIG. 17 illustrates the distribution of radiant intensity on the entrance aperture illustrated in FIG. 16, namely, the angular distribution before the incident light is reflected by the reflective curving-surface device 1032. Herein, the reflective curving-surface device 1032 provides an optical reflection mapping function. The angle between ±18° is produced by a central Fresnel lens 1012, and the angle between +40° to 90° is produced by the reflective inner curving surface of the light concentrating device 1030. It can be understood from FIG. 17 that the larger the incident angle is, the lower the radiant intensity is. If the chip is directly disposed on the aperture, less power will be absorbed by the chip because of lot of light reflection occurred between the air and the chip surface at large incident angel situation.

Figure 18:
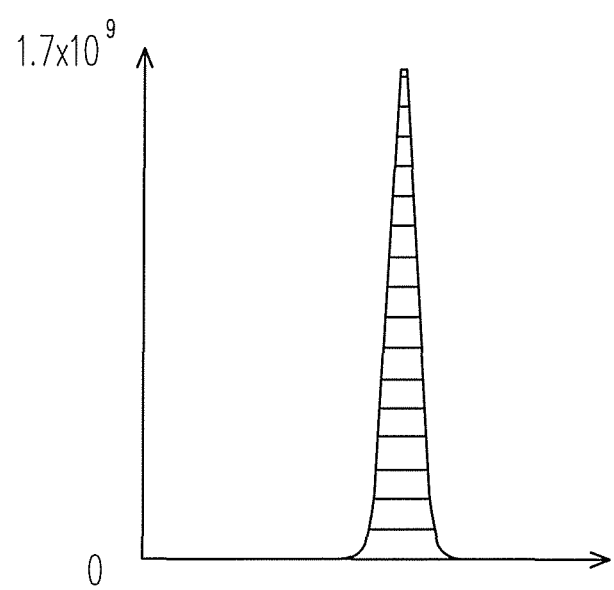
FIG. 18 illustrates the irradiance at the entrance of a curving-surface reflection device 1032.

FIG. 18 illustrates the irradiance above the reflective curving-surface device 1032. The solar incident power is 1,000 W/m$^2$, and it can be understood by analyzing the irradiance that the local light concentrating ratio reaches 1.7*10$^9$ W/m$^2$, which is about 1.7*10$^6$ times of the solar power. If such an irradiance distribution of high light concentrating ratio is applied to a solar photovoltaic light collector, highly concentrated thermal stress may be caused on the solar cell and the uneven irradiance may reduce the photoelectric conversion efficiency thereof.

Figure 19:
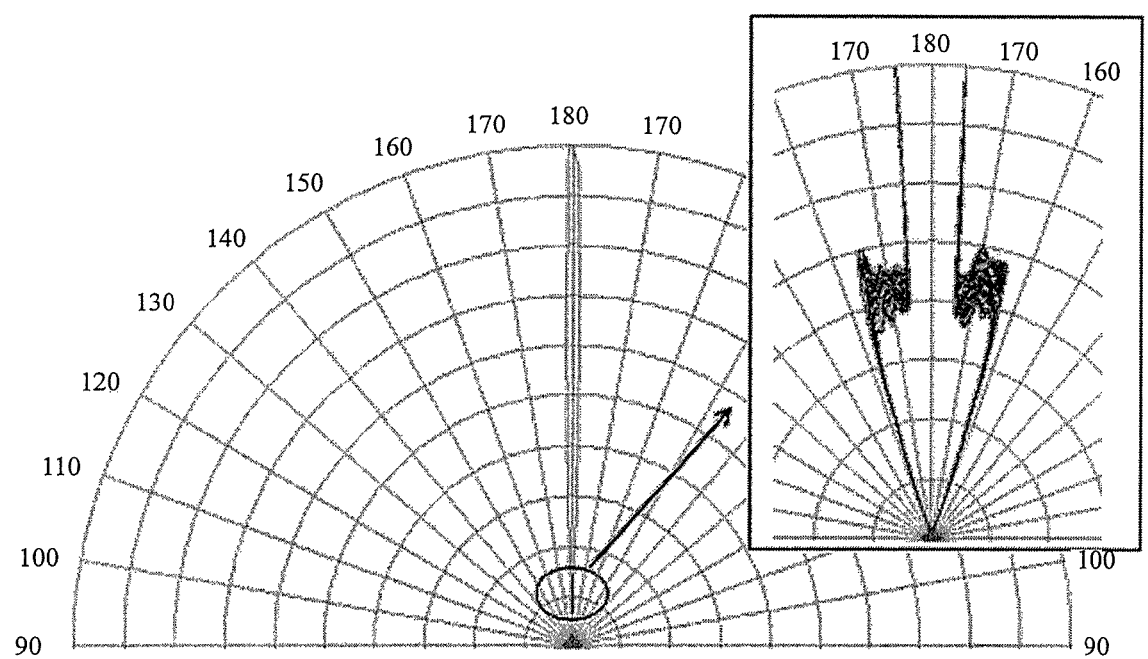
FIG. 19 illustrates the intensity at the exit aperture of a curving-surface reflection device.

FIG. 19 illustrates the intensity on a receiving element below a reflective curving-surface device. As shown in FIG. 19, even though there is still incident light having incident angle between ±18° because of the central Fresnel lens, most incident lights enter the solar cell with high intensity at 0°. And, if the sun subtended angle is taken into consideration, the angular distribution below +10° would still be obtained.

Figure 20:
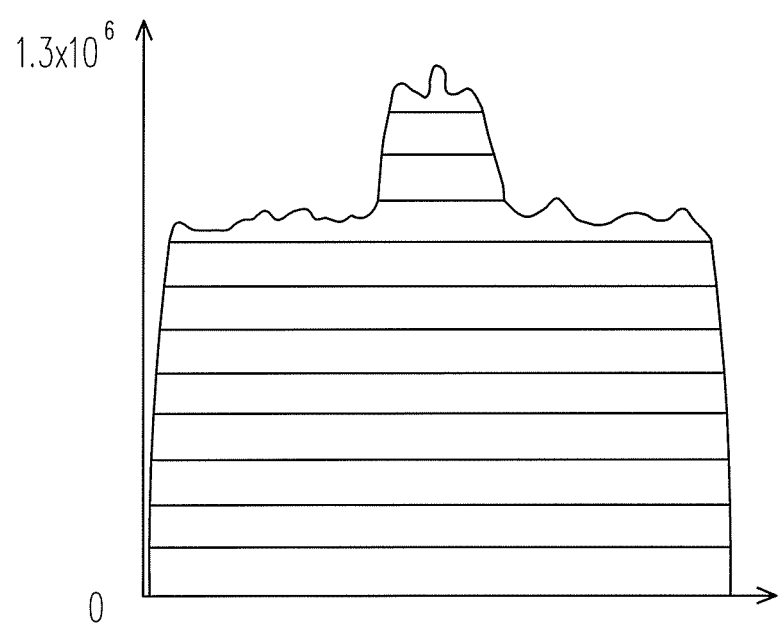
FIG. 20 illustrates the distribution of irradiance at the exit aperture of a curving-surface reflection device.

FIG. 20 illustrates the distribution of irradiance on a receiving element below a reflective curving-surface device. As shown in FIG. 20, the highest local irradiance is 1.2*10$^6$ W/m$^2$, which is about 1,200 times of the sun radiation, corresponding to the nominal concentration ratio 800, and the surrounding optically mapped area preset a uniform irradiance distribution. Moreover, the central irradiance can also be designed to be as uniform as the reflective mapped-light irradiance.

According to the analysis of angular and spatial distributions as illustrated in FIG. 19 and FIG. 20, in a light collection system provided by the present invention, incident lights of smaller incident angles can be obtained on a solar cell so that the absorption of the solar cell can be greatly increased. Besides, the photovoltaic conversion efficiency of the solar cell is improved thanks to the uniform irradiance. Moreover, hot spot on the solar cell is also avoided because of the uniform irradiance. Foregoing advantages are easy to achieve in packaging and heat dissipation processes and increase the possibility of further improving the efficiency (~2,000×) of a solar light collection module.

Figure 21:
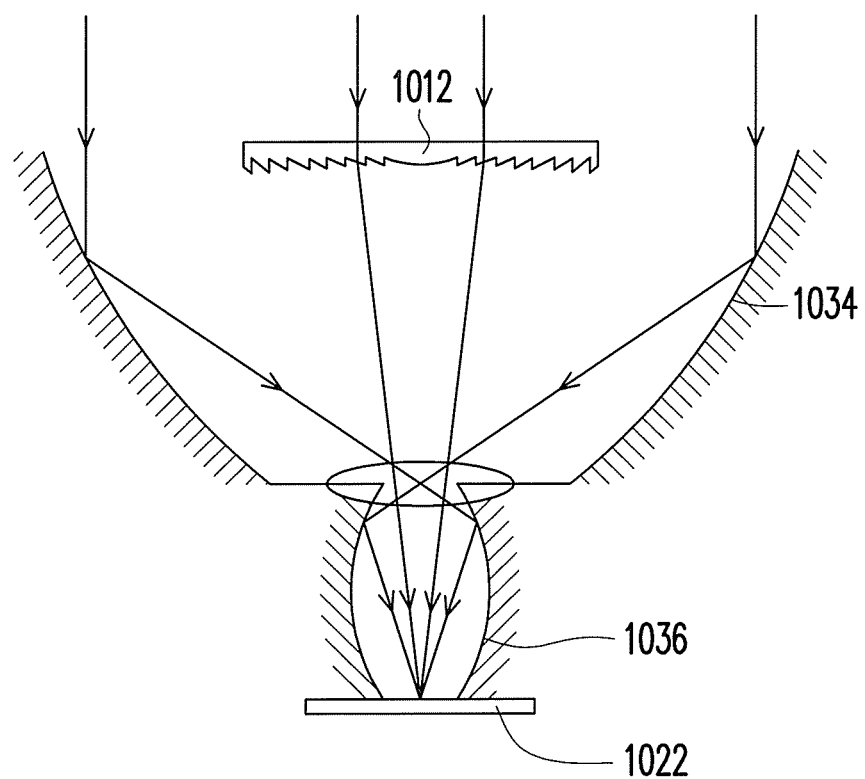
FIG. 21 is a cross-sectional drawing illustrating a paraboloid and a confocal elliptical curving surface according to an embodiment of the present invention.

FIG. 21 is a cross-sectional drawing illustrating a paraboloid and an elliptical reflective curving surface which are confocal to each other according to an embodiment of the present invention. Referring to FIG. 21, among different designs of reflective curving surface, quadratic function curve is a preferred design since it comes with a focus. In the present embodiment, the light concentrating device 1034 is still a paraboloid, while the reflective curving-surface device 1036 is an elliptical curving surface. The mathematical characteristics of ellipse is a curving surface with two focuses, and a light passing through the first focus is reflected by a reflective inner layer of the ellipse and enters the second focus at a different incident angle.

Figure 22:
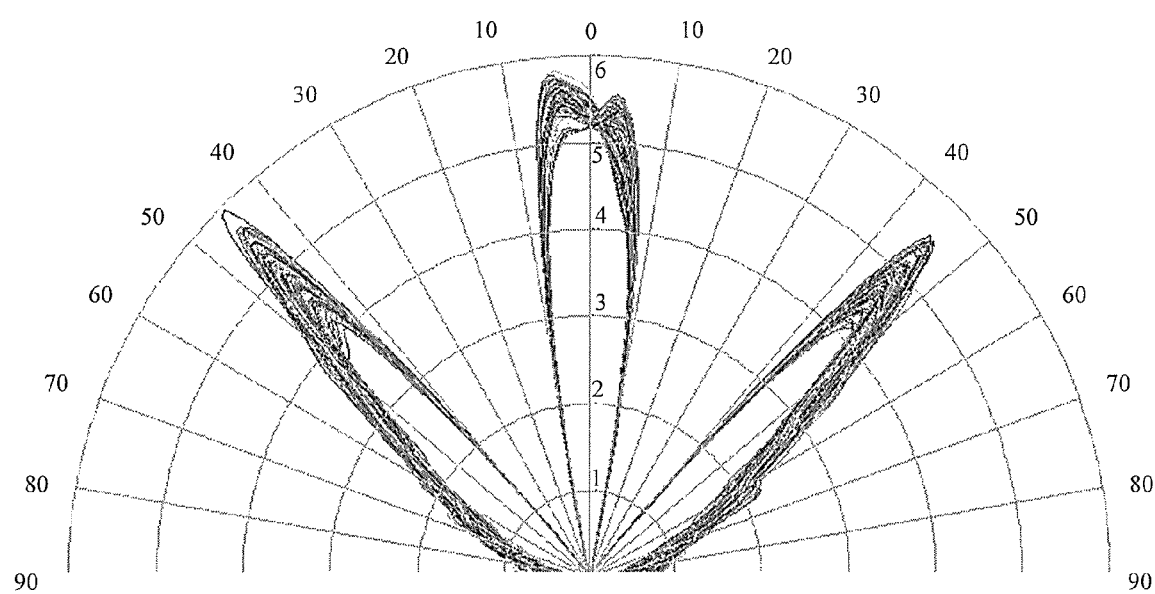
FIGS. 22-23 are drawings illustrating the irradiance and intensity at the entrance of a curving-surface reflection device according to embodiments of the present invention, respectively.
Figure 23:
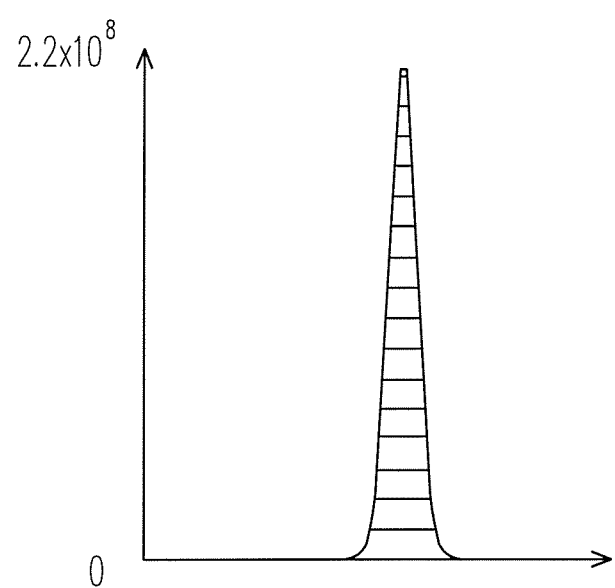
Figure 24:
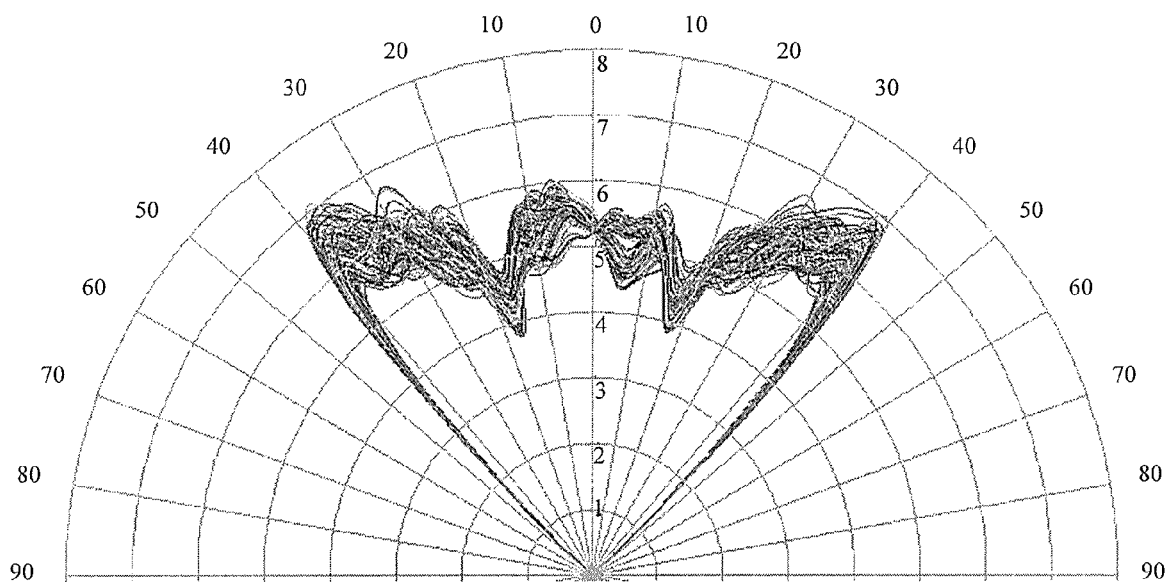
FIGS. 24-25 are drawings illustrating the irradiance and intensity at the exit aperture of a curving-surface reflection device according to embodiments of the present invention, respectively.
Figure 25:
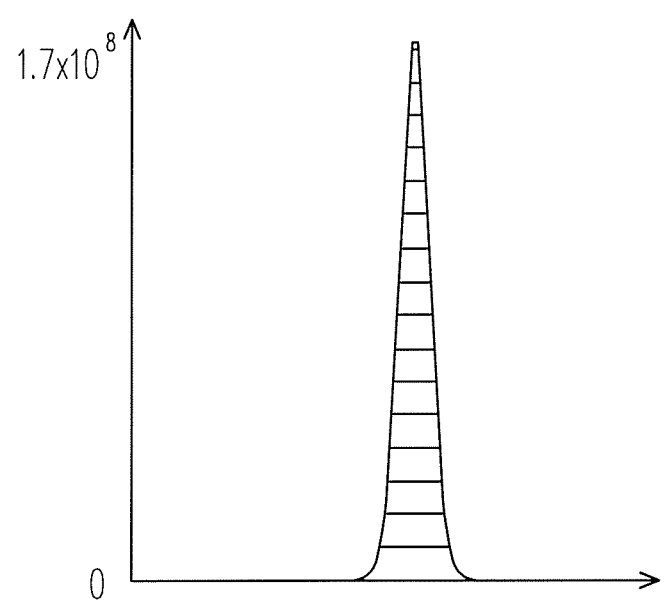

FIGS. 22-23 are respectively drawings illustrating the intensity and irradiance at the entrance of the reflective curving-surface device 1036 according to embodiments of the present invention. FIGS. 24-25 are respectively drawings illustrating the intensity and irradiance at the exit aperture (or the receiver) of the reflective curving-surface device 1036 according to embodiments of the present invention.

Referring to FIG. 23 and FIG. 25, the two spatial distribution shapes have no obvious difference. Referring to FIG. 22 and FIG. 24, the angular distribution is changed from the original distribution of large angle (±0°~18° in the center and ±40°~90° at the peripheral) into a distribution of smaller angle (±40°). It can be concluded based on the analysis of the intensity and irradiance that the design of disposing a light collection lens between a paraboloid and an elliptical curving surface can achieve an effect that incident lights enter an absorber at smaller incident angles without changing the irradiance, where the smaller incident angles refers to higher optical efficiency. Furthermore, in the present invention, the incident angle on the receiver could be designed to converge within 20 degrees.

Besides the combination of paraboloid and elliptical curving surface, the curving surfaces may also adopt other designs. When the surfaces are applied to a large solar light collection system, the curving surfaces may also be composed of many small planes. For example, several small ring planes with different radius and slanting angles for reflecting light are composed together by a manner of joining one by one or concentrically stacking, so that the reflected light from each ring planes can be focused to a focal region.

Moreover, the cross-sectional structure of a light collection system in the present invention is described in the embodiments described above. Generally, a light collection system in the present invention has an axial symmetrical structure. In other words, the cross section perpendicular to the incident light has a circular shape. However, the cross sectional structure of the light collection system is changed correspondingly when the shape of the receiving element is rectangular.

Figure 26:
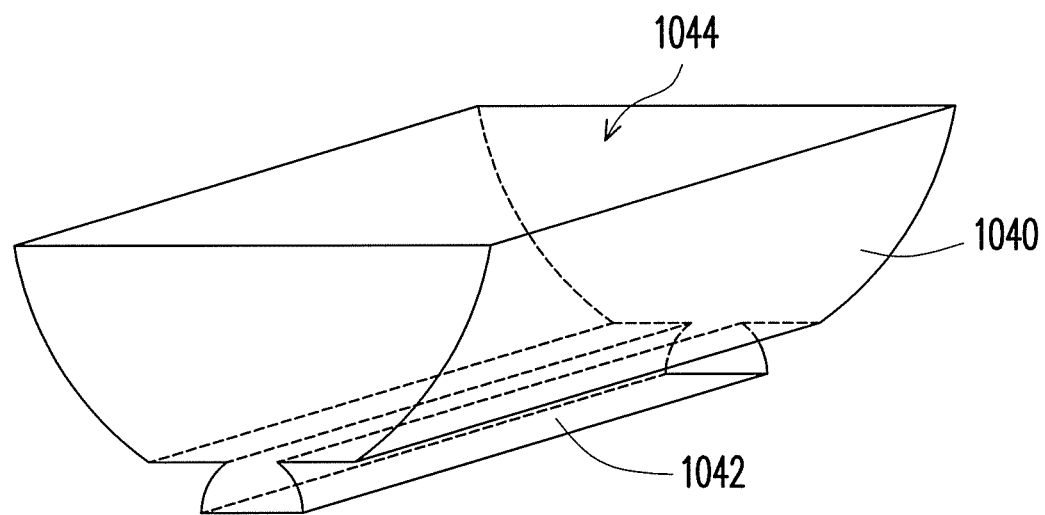
FIGS. 26-27 are perspective drawings of a light collection system according to embodiments of the present invention.
Figure 27:
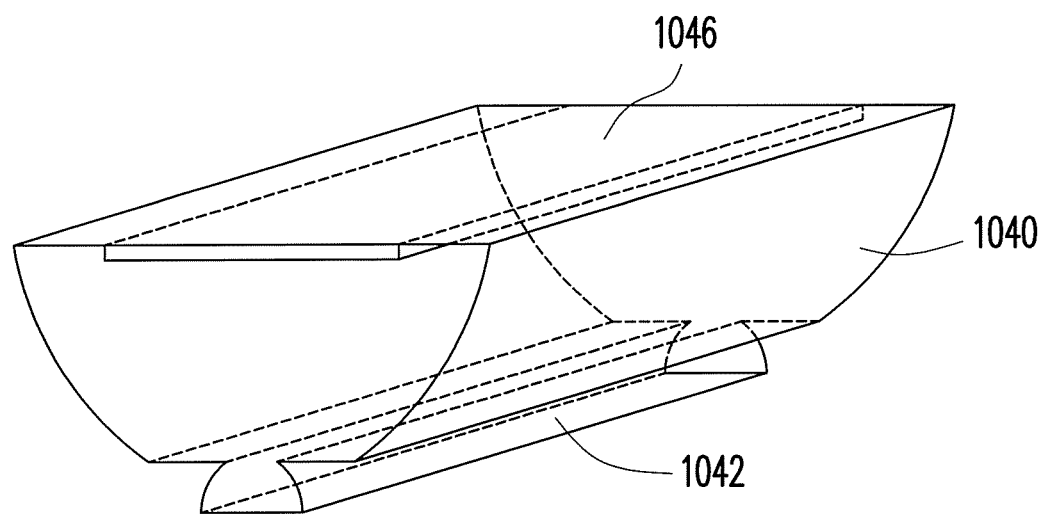

FIGS. 26-27 are perspective drawings of a light collection system according to embodiments of the present invention. Referring to FIG. 26, taking the cross-sectional structure in FIG. 14 as an example, the light concentrating device 1040 and the reflective curving-surface device 1042 have a square or rectangular cross-section in another direction, wherein the rectangular cross section is more efficient than the square cross section. If the light concentrating device 1040 and the reflective curving-surface device 1042 have a solid structure, the inside portions 1044 thereof are made of the same material or two materials having close refractive indexes. However, the inside portions 1044 have a hollow structure if the design illustrated in FIG. 9 is adopted.

Referring to FIG. 27, similarly, the sub light concentrating device 1046 can be disposed in the center to adjust the incident angles of incident lights in the central area. The sub light concentrating device 1046 may have a convex structure, a sawtooth structure, or a linear Fresnel light concentrating structure. As shown in FIG. 26, the inside portion 1044 thereof may be solid or hollow.

Figure 28:
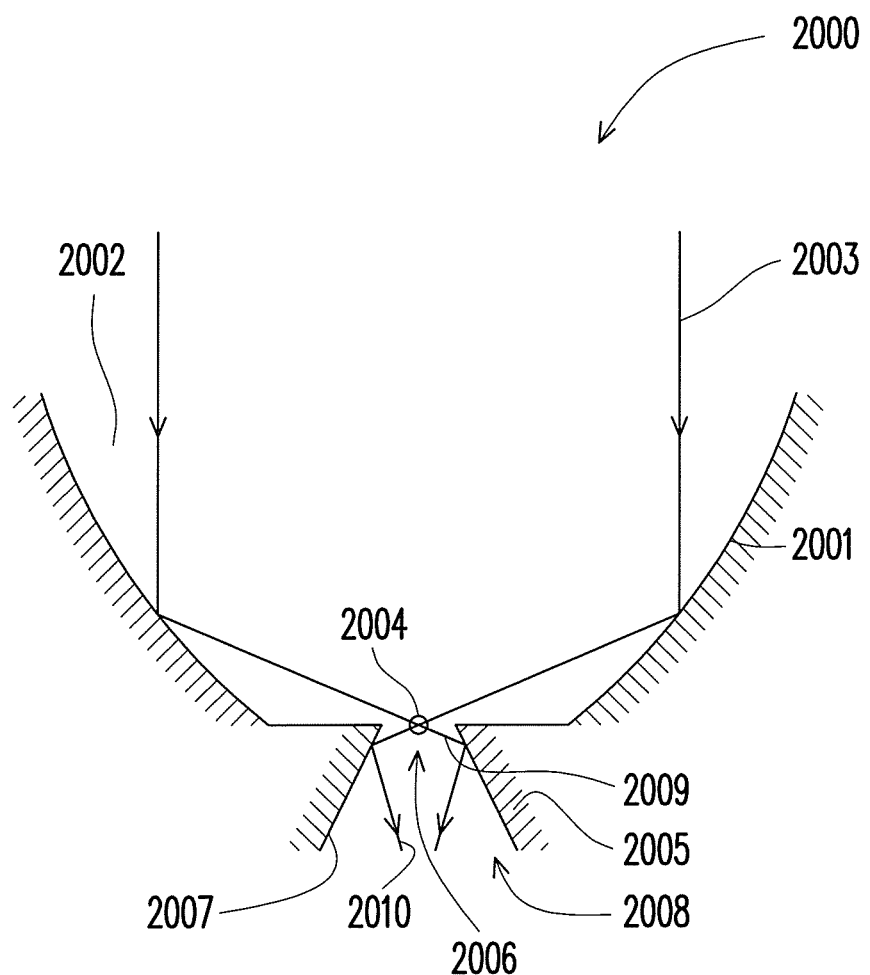
FIG. 28 is a cross-sectional drawing of a light collection system according to another embodiment of the present invention.

In the embodiment described above, even though the secondary optical element at the bottom is composed of curving surfaces which can produce a focal region, the cross-sectional curve thereof is a curve having a non-zero curvature. However, the reflective surface device has two possible forms of structure: First, a curvature of the cross-sectional curve may also be zero; namely, the cross-sectional curve may also be a straight line. Second, the reflective surface device is composed of several flat surfaces, for example, four ladder-shaped planes or four rectangular planes to form a self-contained reflective surface. FIG. 28 is a cross-sectional drawing of a light collection system according to another embodiment of the present invention. Referring to FIG. 28, in the present embodiment, the light collection system 2000 includes a light concentrating device 2001, wherein the light concentrating device 2001 has a first reflective curving surface 2002. The light concentrating device 2001 receives at least a portion of an incident light 2003. The portion of the incident light 2003 is reflected by the first reflective curving surface 2002 and then forwardly output after being concentrated and passed through a first focal region 2004, so that a first-stage output light 2009 is obtained. A reflective surface device 2005 has an entrance aperture 2006, a second reflective surface 2007, and an exit aperture 2008. The reflective surface device 2005 may have a cone shape, and the cross-sectional curve of the cone shape is a sloping line having a zero curvature so that it is not necessary to form a light concentration curving surface with a focal region. The entrance aperture 2006 receives the first-stage output light 2009 so that at least a portion of the first-stage output light is reflected by the second reflective surface 2007 to obtain a forwardly emitted second-stage output light 2010.

Figure 29A:
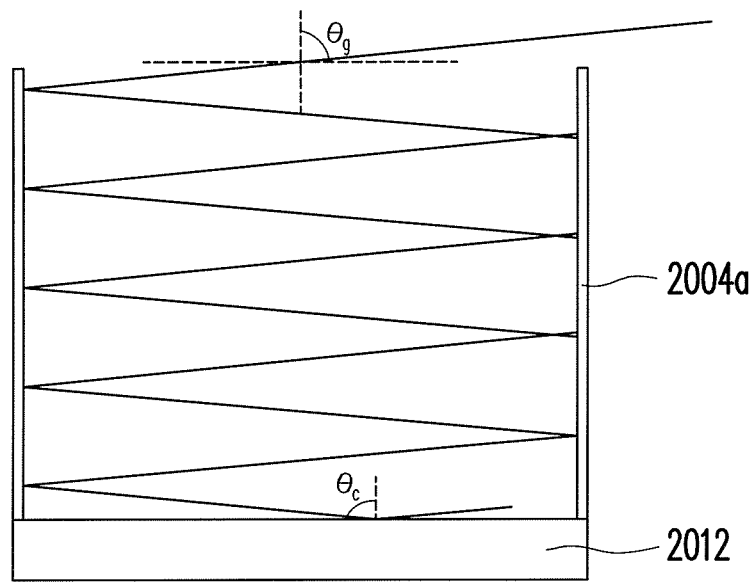
FIGS. 29A-29C are cross-sectional drawings of a secondary optical structure in the light collection system in FIG. 28 according to some other embodiments of the present invention.
Figure 29B:
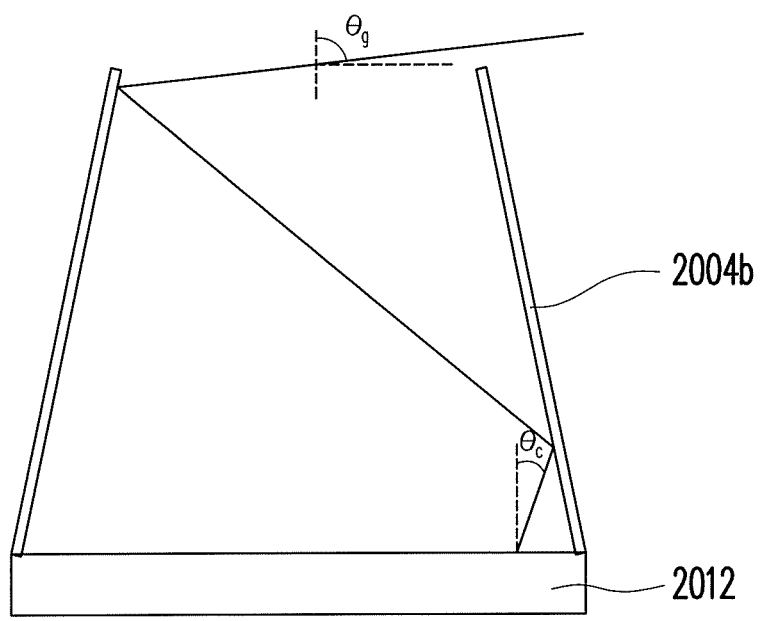
Figure 29C:
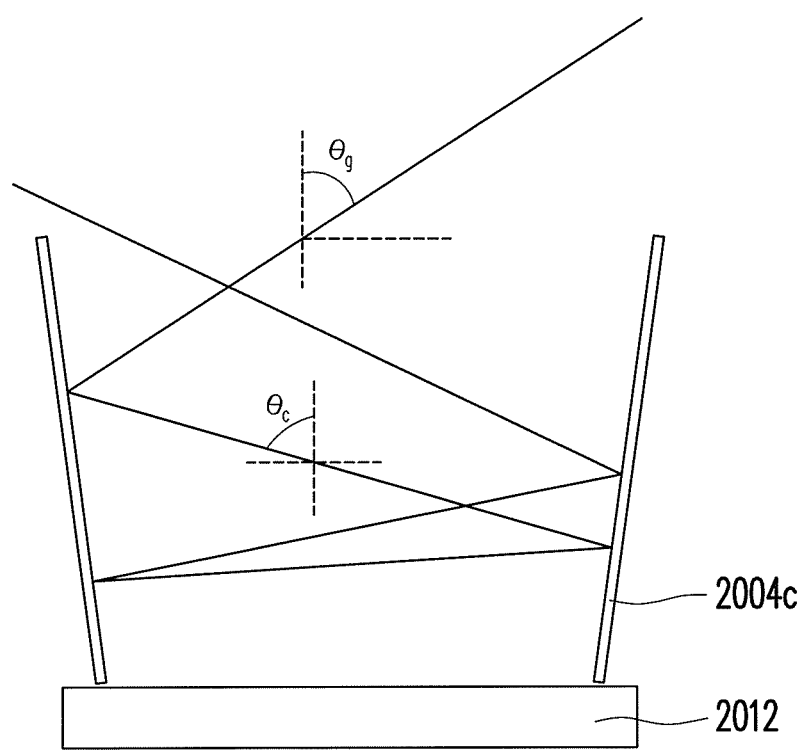

FIGS. 29A-29C are cross-sectional drawings of a secondary optical structure in the light collection system in FIG. 28 according to some other embodiments of the present invention. Referring to FIG. 29A, if the cross section of the light collection system has a rectangular shape, two opposite sides of the rectangle are parallel to each other. Thus, an incident light having an incident angle θg enters the working device 2006 at an angle θc, wherein θg=θc. This design can be applied when the optics has a smaller acceptance angle, so the entrance aperture has to be increased.

Referring to FIG. 29B, if the opposite two sides are running apart, the incident light having the incident angle θg enters the working device 2012 at an angle θc, wherein θg>θc. This design allows an incident light entering the working device having a smaller incident angle so that a higher optical efficiency can be obtained.

Referring to FIG. 29C, if the opposite two sides are running toward each other, the incident light having the incident angle θg enters the working device 2012 at an angle θc, wherein θg<θc, and some incident lights having large incident angles are reflected so that they do not enter the working device 2012, as shown in FIG. 29C. This design offers larger entrance aperture and wider range of acceptance angle but sacrifices a bit of the optical efficiency.

The designs illustrated in FIGS. 29A~29C have some differences but can all be adopted according to the actual design.

Figure 30:
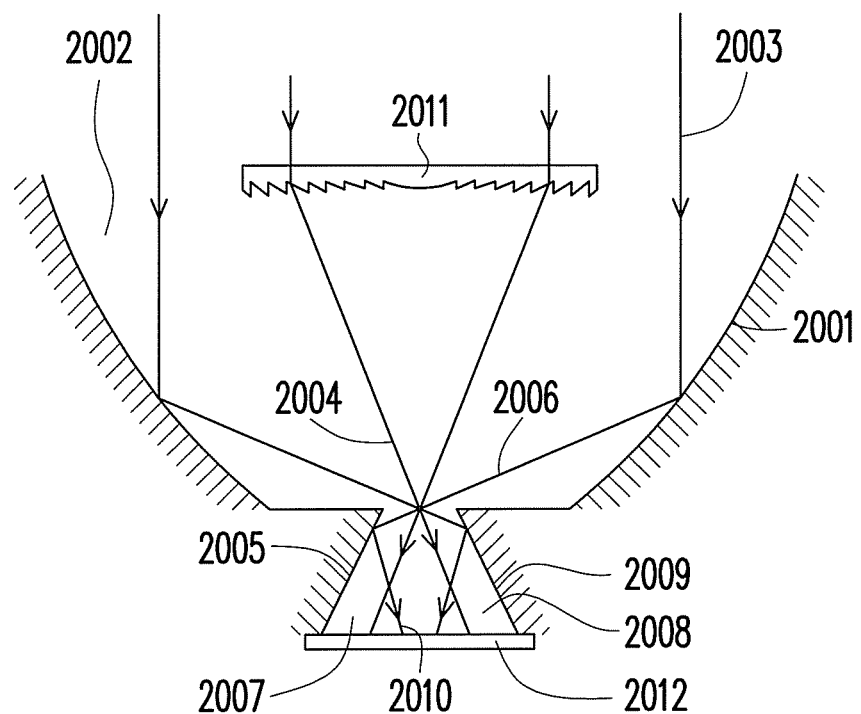
FIGS. 30-31 are cross-sectional drawings of a light collection system according to embodiments of the present invention.
Figure 31:
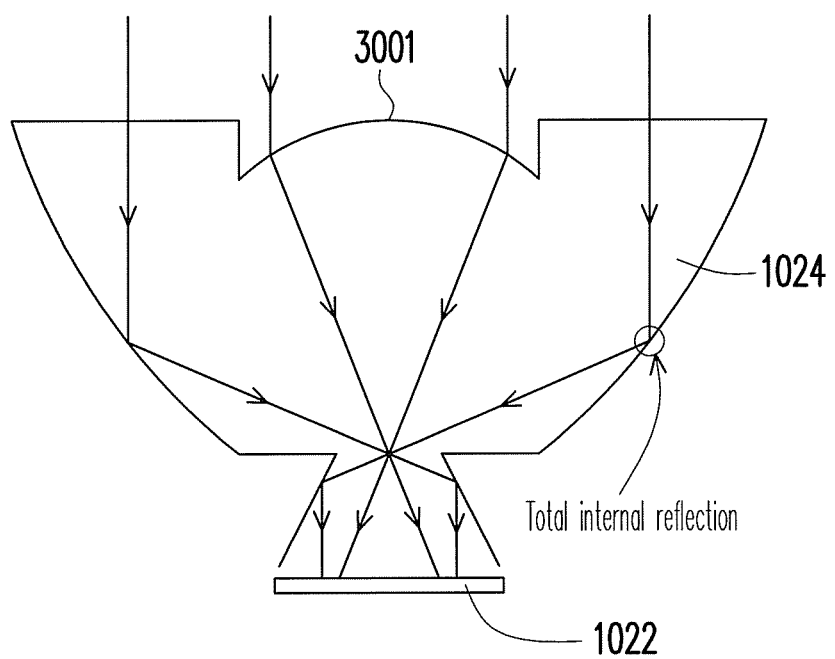

FIGS. 30-31 are cross-sectional drawings of a light collection system according to another embodiment of the present invention. Referring to FIG. 30, the light concentrating device 2011 described above further receives another portion of the incident light (e.g. the central part) and then emits the concentrated light to working device 2012 to achieve the light energy conversion effect, wherein the optical path and the structure of the light collection system are as shown in FIG. 30. In the present embodiment, the reflective surface device 2005 of the secondary optical element does not have to produce a focal region.

Referring to FIG. 31, similarly, if a solid structure is adopted, the reflection curving surfaces can be achieved through optical TIR. Similar to the structure illustrated in FIG. 15, a convex profile 3001 is further designed for concentrating the lights in the central area. The structure in the present embodiment may be changed according to the reflective surface device 2005 of the secondary optical mechanism and accordingly the obtained effect may also be different without departing the scope and spirit of the present invention.

If the optical design in the present invention is applied to a solar-thermal light collection system, the acceptable angle of the light collection system can be increased, and high light collection ratio and high optical absorption performance can be obtained. In a design wherein an absorber is disposed below a light concentration device, the energy conversion system is easy to be implemented, and the cover layer structure reduces the expense for maintaining and cleaning the light collection system, so the whole light collection system exposed to all weathers can be protected from damages.

Figure 32:
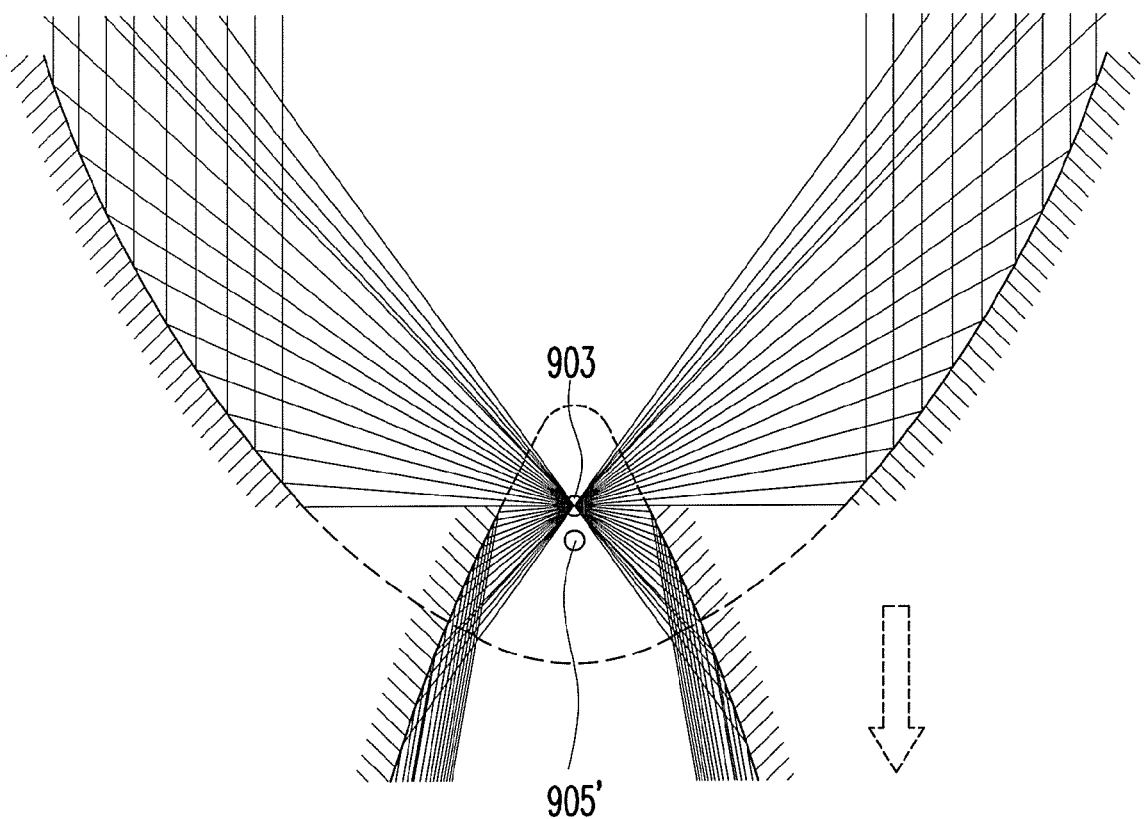
FIGS. 32-34 are schematically cross-sectional drawings of a light collection system with approximately confocal configurations, according to embodiments of the present invention.
Figure 33:
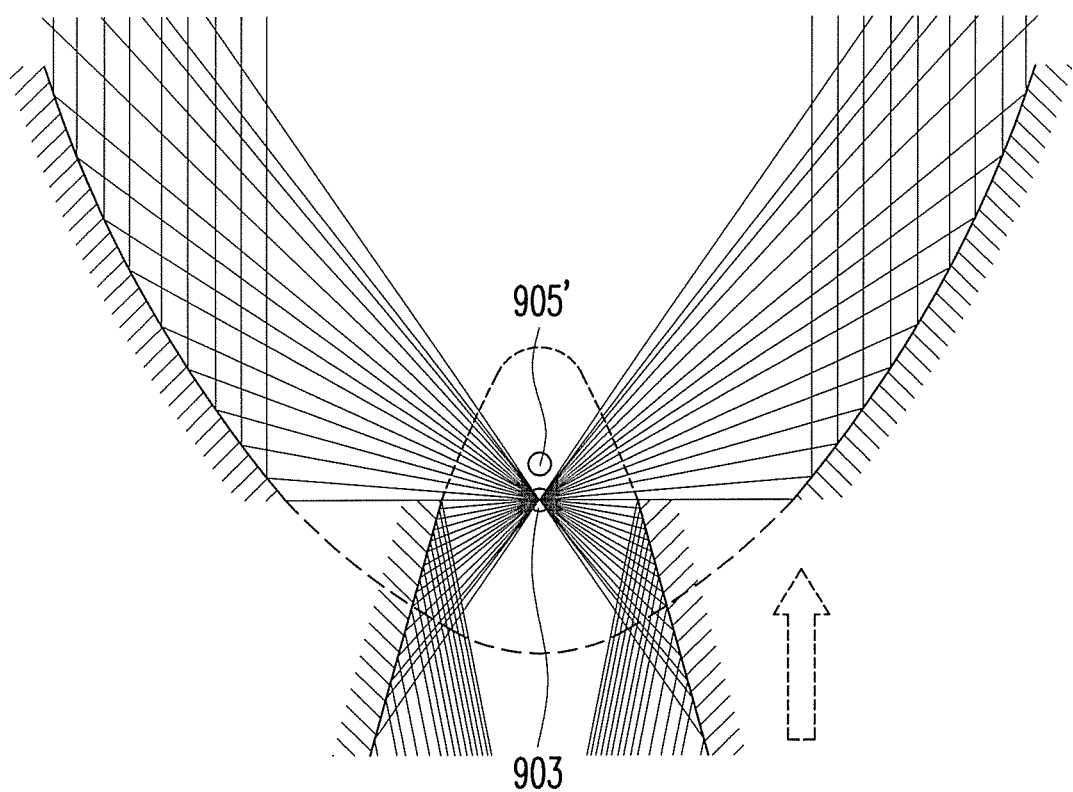
Figure 34:
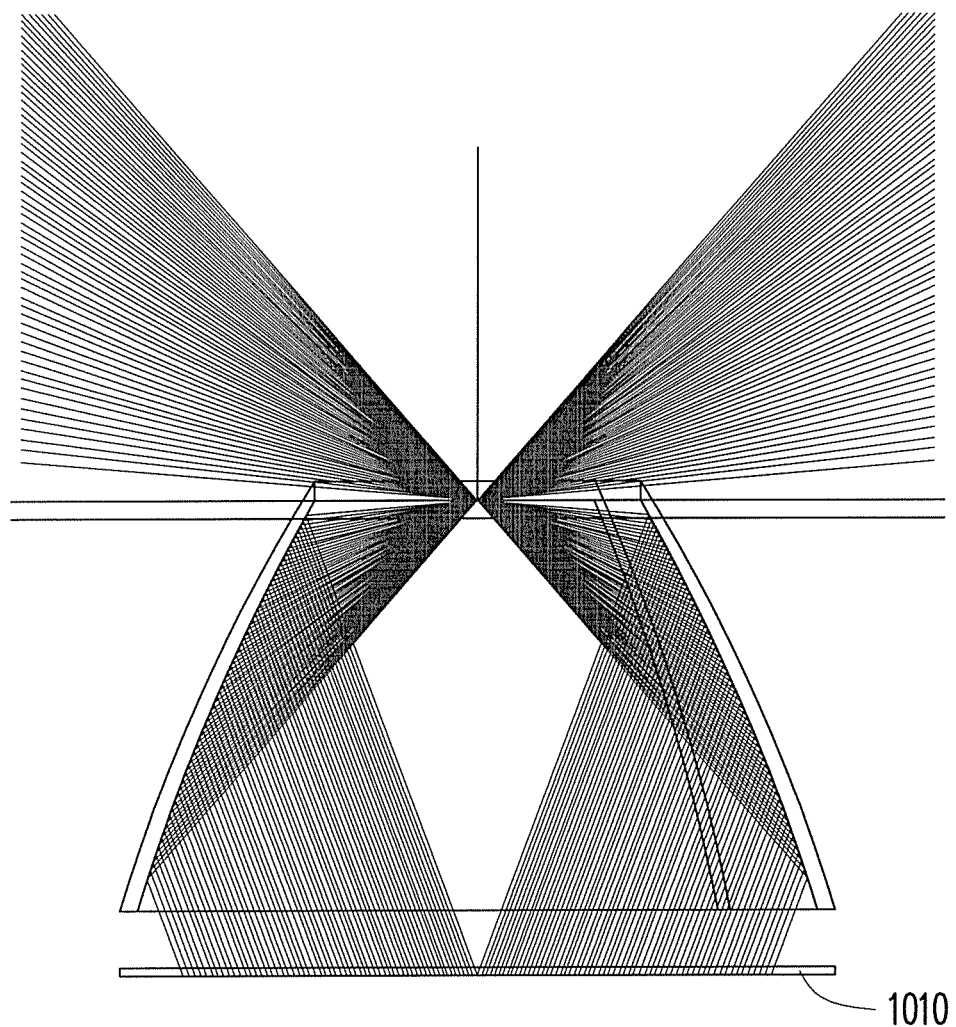

In the foregoing examples, the two focal regions are in confocal configuration. However, when the two focal regions are approximately confocal with shift by a region within the radius of the entrance aperture is still acceptable. FIGS. 32-34 are schematically cross-sectional drawings of a light collection system with approximately confocal configurations, according to embodiments of the present invention.

In FIG. 32, the first focal region 903 is for the primary optical element and the second focal region 905' is for the secondary optical element which is, for example, a paraboloid. If the position of the secondary optical element is moved down from the confocal position, at the same time the second focal region 905' is also shifted down, as indicated by the arrow. The light path is simulated. As a result, the reflected light by the secondary optical element is more divergent. In FIG. 33, the secondary optical element is moved upward as indicated by the arrow. In this situation, the light reflected by the secondary optical element is more convergent. Generally, the off-confocal configuration can be set according to the according to the actual design. The focal region 905' can be shifted from the focal region 903 by a range within a radius of the entrance aperture. In other words, as far as irradiance uniformity is concerned, the two focal regions can be confocal or approximately confocal within a range, preferably within a radius of the entrance aperture, for example.

In FIG. 34 as a result from simulation, when the focal region 905' is moved up to a certain position, the reflection light may be sufficient convergent to fully cover the receiving element 1010. Here, the central portion of the incident light may be used or not used, depending on the actual need. However, for the situation in FIG. 34, the central portion of incident light may be ignored while a rather uniform irradiance on the receiving element 1010 can be obtained. The incident angle is also rather small to the receiving element 1010.

Figure 35:
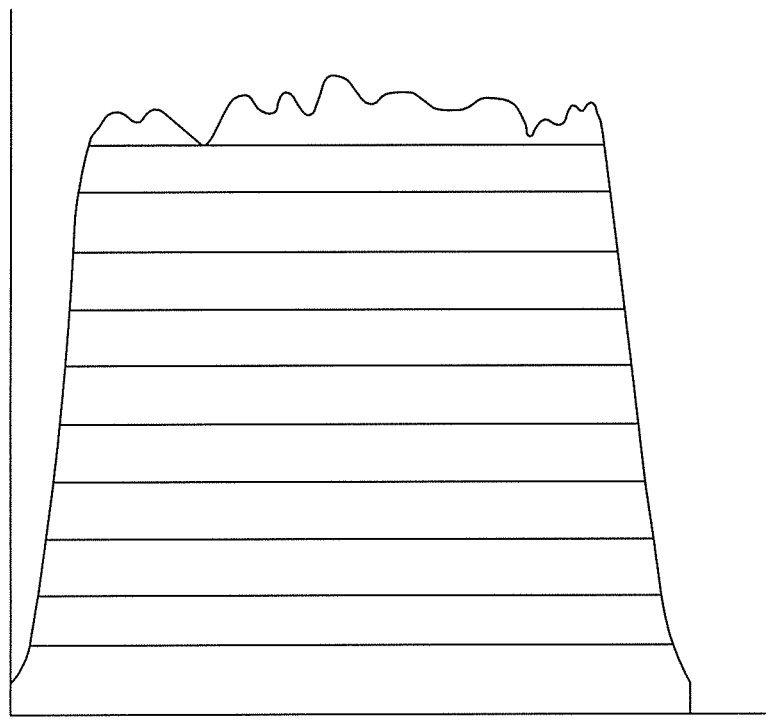
FIG. 35 is a drawing, schematically illustrating the distribution of irradiance based on one of the light collection systems of the present invention.

FIG. 35 is a drawing, schematically illustrating the distribution of irradiance based on one of the light collection systems of the present invention. In FIG. 35, for the situation in FIG. 34, the simulated distribution of the irradiance on the receiving element is shown. The irradiance is rather uniform.

For the application in CPV system, the irradiance uniformity is much relating to the chip efficiency. A solar chip may have an ideal light collecting factor, such as 1000×, in design. However, if the irradiance is not uniform, the local region of the receiving element may be up to 20,000× at the local region of 5%. The actual light fill factor on the solar chip is just a small percentage, such as 58%, resulting in a low operation efficiency of 17%, for example. However, in the same requirement of 1000× for the solar chip, the present invention can be about remaining at 1000× for the light area, and then the fill factor can be up to 85%, for example. As a result, the operation efficiency of solar chip can be 24%.

From the other point, the present invention proposes a designing parameter as a local light-collecting ratio by a ratio of:

$$r = (\text{peak concentration})/(\text{geometrical concentration}). \quad (1)$$

The geometrical concentration is defined as a ratio of (optics area/chip area). The peak concentration is the largest intensity in the irradiation distribution, basically referring to the local high-intensity region. Take the geometrical ratio 500× Fresnel lens for example, the peak concentration is about 2,500×, so the r ratio is 5. The present invention can be reduced to 5 or less. The present invention has observed that the local light-collecting ratio for some conventional designs is 8 in average, which means that the local concentration is too strong, causing low conversion efficiency for the conventional solar chips.

Figure 36:
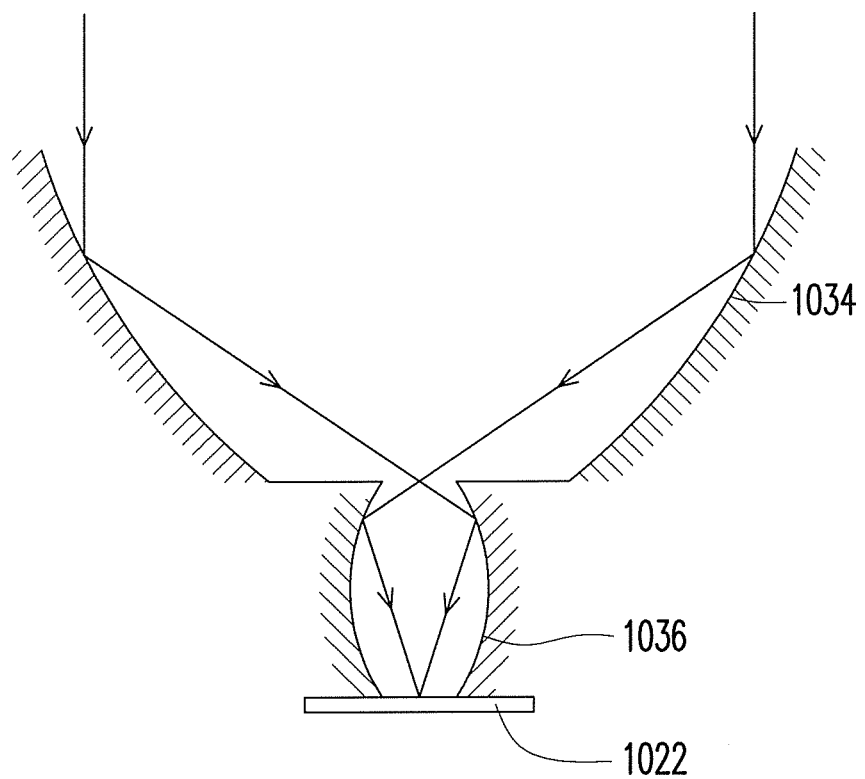
FIG. 36 is a cross-sectional drawing of a light collection system, according to embodiments of the present invention.

Further in other applications for thermal collection, such as solar thermophotovoltaics (TPV) or solar thermal in CSP system, the uniform irradiance is not necessary to be much concerned. Instead, the total energy of the incident light to the receiving element is concerned, in which a small focal spot may be much intended. FIG. 36 is a cross-sectional drawing of a light collection system, according to embodiments of the present invention. In FIG. 36, the secondary optical element 1036 is to produce the concentrated light beam to enter the receiving element 1022 with small incident angle. In this manner, the secondary optical element 1036 can be, for example, elliptic in cross-section, which has two focal regions. One of the two focal regions is conjugated with the focal region of the light concentrating device 1034 and the other one of the two focal regions is setting on the receiving element 1022, for example. As far as small angular distribution demand (referring to higher optical efficiency) is concerned, in the present invention the two focal regions can be confocal or approximately confocal within a range, preferably within a diameter of the entrance aperture or larger, for example.

As a result, the collected light can be focalized on the receiving element 1022, which is converting the thermal energy to the system.

In the present invention, a reflective secondary optical element is adopted such that an incident light can enter an absorber at a very small incident angle, and accordingly, the light absorption efficient of the absorber can be improved.

The light collection system provided by the present invention has very simple structure and low fabrication cost. Besides, the problem of reduced optical efficiency caused by process error in the conventional technique is effectively resolved. Accordingly, the light collection system in the present invention can be mass produced easily.

The collected light energy can be converted and applied in different manners. A light energy conversion device in a light energy conversion apparatus may be a semiconductor device which directly converts a light energy into an electrical energy, wherein the semiconductor device may be a PV cells, such as silicon, an Ill-V group compound, a CIS, a CIGS, or a CdTe materials.

In addition, a thermal energy storage/conversion apparatus receives at least the collected light and stores the thermal energy or converts the thermal energy into a non-optical energy. The thermal energy storage/conversion device may also directly store the thermal energy of the light into a thermal receiver, wherein the thermal receiver may be a directly-heated receiver or a thermal receiver with liquid sodium as a medium. Besides, the thermal receiver absorbs the thermal energy of the collected light and converts the thermal energy into an operating gas in an engine, wherein the engine may be a Stirling engine or a Brayton engine.

Moreover, the thermal energy storage/conversion device may use the thermal energy for pyrolyzing a liquid hydrogen producing element, wherein the liquid may be water or methanol.

Furthermore, the thermal energy storage/conversion device may be a hydrogen producing element based on a thermo-electricity optical mechanism.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light collection system, comprising:
a light concentrating device, for receiving a portion of an incident light and forwardly emitting the portion of the incident light after concentrating and passing the portion of the incident light through a first focal region, so as to obtain a first-stage output light, wherein the light concentrating device has a reduced exit aperture and the first focal region is within the reduced exit aperture;
a reflective curving-surface device, having an entrance aperture for receiving the first-stage output light, wherein the reflective curving-surface device comprises:
a reflective inner curving surface having a second focal region, wherein the first focal region and the second focal region are confocal or approximately confocal within a range so that a portion of the first-stage output light is confocally converted into a second-stage output light being forwardly emitted; and
an exit aperture, configured to transmit the second-stage output light toward a target area where the second-stage output light is received; and
a bonding structure, as a ring-like structure, wherein the bonding structure has an outer peripheral edge to join with the reduced exit aperture of the light concentrating device and an inner peripheral edge to join with the entrance aperture of the reflective curving-surface device, wherein the light concentrating device also comprises a lens focusing element at a central region, over the bonding structure, to receive a central-portion light of the incident light, not concentrated by the light concentrating device, as a central concentrated light, the central concentrated light is incident onto the target area, wherein the central-portion light concentrated by the lens focusing element at the central region is first passed through the first focal region before divergently reaching the target area.

2. The light collection system according to claim 1, wherein the light concentrating device includes a sawtooth light concentrating device, a Cassegrain light concentrating device, or a refraction(R)-reflection(X)-TIR(I) (RXI) light concentrating device.

3. The light collection system according to claim 1, wherein the reflective inner curving surface of the reflective curving-surface device includes a paraboloid, a hyperboloid, or an elliptical curving surface.

4. The light collection system according to claim 1, wherein the light concentrating device comprises a light collecting reflective curving surface having the first focal region.

5. The light collection system according to claim 4, wherein the lens focusing element of the light concentrating device is a sub light concentrating device.

6. The light collection system according to claim 5, wherein the sub light concentrating device comprises a convex lens, a Fresnel lens, or a sawtooth light concentrating device.

7. The light collection system according to claim 5 further comprising a supporting structure for supporting the sub light concentrating device.

8. The light collection system according to claim 4, wherein the reflective curving-surface device is a metal-surface reflective curving surface.

9. The light collection system according to claim 8, wherein the metal-surface reflective curving surface includes a paraboloid, a hyperboloid, or an elliptical curving surface.

10. The light collection system according to claim 1, wherein a curving surface structure for forming the first focal region and/or the second focal region is a composition of a plurality of curving surfaces.

11. The light collection system according to claim 1, wherein a curving surface structure for forming the first focal region and/or the second focal region is a curving surface formed by a plurality of planes.

12. The light collection system according to claim 1, wherein the light concentrating device and the reflective curving-surface device are bonded into a structural entity or manufactured as a unity.

13. The light collection system according to claim 1, wherein the light concentrating device and the reflective curving-surface device are metal-surface reflective devices.

14. The light collection system according to claim 1, wherein the second focal region formed by the reflective inner curving surface of the reflective curving-surface device is a point-like region.

15. A light energy conversion apparatus, comprising:
a light concentrating device, for receiving a portion of an incident light and forwardly emitting the portion of the incident light after concentrating and passing the portion of the incident light through a first focal region, so as to obtain a first-stage output light, wherein the light concentrating device has a reduced exit aperture and the first focal region is within the reduced exit aperture;

a reflective curving-surface device, having an entrance aperture for receiving the first-stage output light, wherein the reflective curving-surface device comprises:
a reflective inner curving surface having a second focal region, and the first focal region, wherein the second focal region are confocal or approximately confocal within a range so that a portion of the first-stage output light is confocally converted into a second-stage output light being forwardly emitted; and
an exit aperture configured to transmit the second-stage output light toward a target area where the second-stage output light is received;

a bonding structure, as a ring-like structure, wherein the bonding structure has an outer peripheral edge to join the reduced exit aperture of the light concentrating device and an inner peripheral edge to join with the entrance aperture of the reflective curving-surface device; and a light energy conversion device, for receiving the second-stage output light and converting an optical energy of the second-stage output light into a non-optical energy, wherein the light concentrating device also comprises a lens focusing element at a central region, over the bonding structure, to receive a central-portion light of the incident light, not concentrated by the light concentrating device, as a central concentrated light, the central concentrated light is incident onto the target area, wherein the central-portion light concentrated by the lens focusing element at the central region is first passed through the first focal region before divergently reaching the target area.

16. The light energy conversion apparatus according to claim 15, wherein the second focal region formed by the reflective inner curving surface of the reflective curving-surface device is a point-like region.

17. The light energy conversion apparatus according to claim 15, wherein the light energy conversion device comprises at least one photovoltaic cell, or a thermal energy storage/conversion device.

18. A light collection method, comprising:
providing a light concentrating device for receiving a portion of an incident light, and forwardly emitting the portion of the incident light after concentrating and passing the portion of the incident light through a first focal region, so as to obtain a first-stage output light, wherein the light concentrating device has a reduced exit aperture for letting the first-stage output light exit and the first focal region is within the reduced exit aperture;

providing a reflective curving-surface device, wherein the reflective curving-surface device has an entrance aperture, an exit aperture, and an reflective inner curving surface having a second focal region;

providing a bonding structure, as a ring-like structure, wherein the bonding structure has an outer peripheral edge to join the reduced exit aperture of the light concentrating device and an inner peripheral edge to join with the entrance aperture of the reflective curving-surface device; and setting the second focal region of the reflective inner curving surface and the first focal region to be confocal or approximately confocal within a range for receiving the first-stage output light and allowing a portion of the first-stage output light to be confocally converted into a forwardly emitted second-stage output light to a receiving device, wherein a central portion light of the incident light, corresponding to the bonding structure, is concentrated as a central concentrated light by a lens focusing element, the central concentrated light by the lens focusing element, not concentrated by the light concentrating device, is incident onto the receiving device, wherein the central portion light is first passed through the first focal region before divergently reaching the receiving device.

19. The light collection method according to claim 18, treating the central concentrated light as a third-stage output light and passing the third-stage output light through the entrance aperture of the reflective curving-surface device, and outputting both the second-stage output light and the third-stage output light.

20. The light collection method according to claim 18, wherein the second focal region of the reflective curving-surface device is a point-like region.

21. A light collection system, comprising:
a light concentrating device, having a first reflective inner curving surface, wherein the light concentrating device receives a portion of an incident light and forwardly emits the portion of the incident light after concentrating the portion of the incident light through the first reflective inner curving surface and passing the portion of the incident light through a first focal region, so as to obtain a first-stage output light, wherein the light concentrating device has a reduced exit aperture and the first focal region is within the reduced exit aperture;
a reflective surface device, having:
an entrance aperture for receiving the first-stage output light, wherein the reflective surface device comprises a second reflective inner surface which reflects a portion of the first-stage output light to obtain a second-stage output light being forwardly emitted; and
an exit aperture, configured to transmit the second-stage output light toward a target area where the second-stage output light is received; and
a bonding structure, as a ring-like structure, wherein the bonding structure has an outer peripheral edge to join the reduced exit aperture of the light concentrating device and an inner peripheral edge to join with the entrance aperture of the reflective surface device,
wherein the light concentrating device also comprises a lens focusing element at a central region, over the bonding structure, to receive a central-portion light of the incident light, not concentrated by the light concentrating device, as a central concentrated light, the central concentrated light is incident onto a receiving device,
wherein the central-portion light concentrated by the lens focusing element at the central region is first passed through the first focal region before divergently reaching the receiving device.

22. The light collection system according to claim 21, wherein a cross-sectional side curve of the second reflective inner surface of the reflective surface device is a curve having a non-zero curvature and has a second focal region.

23. The light collection system according to claim 22, wherein the second focal region of the second reflective inner surface and the first focal region of the first reflective inner curving surface are confocal or approximately confocal within a range.

24. The light collection system according to claim 21, wherein the lens focusing element of the light concentrating device is a sub light concentrating device.

25. The light collection system according to claim 24, wherein the sub light concentrating device includes a convex lens, a Fresnel lens, or a sawtooth light concentrating device.

26. The light collection system according to claim 24 further comprising a supporting structure for supporting the sub light concentrating device.

27. The light collection system according to claim 24, wherein the reflective surface device is a metal-surface reflective surface.

28. The light collection system according to claim 22, wherein the the second reflective inner surface is a paraboloid, a hyperboloid, or an elliptical curving surface.

29. The light collection system according to claim 21, wherein the first reflective inner curving surface structure for forming the first focal region is a composition of a plurality of curving surfaces.

30. The light collection system according to claim 21, wherein the first reflective inner curving surface structure for forming the first focal region is a curving surface formed by a plurality of planes.

31. The light collection system according to claim 21, wherein the light concentrating device and the reflective surface device are bonded into a structural entity or manufactured as a unity.

32. The light collection system according to claim 21, wherein the light concentrating device and the reflective surface device are metal-surface reflective devices.

* * * * *